United States Patent [19]

Watanabe et al.

[11] Patent Number: 5,240,813
[45] Date of Patent: Aug. 31, 1993

[54] POLYSILPHENYLENESILOXANE, PRODUCTION PROCESS THEREOF, AND RESIST MATERIAL AND SEMICONDUCTOR DEVICE FORMED THEREOF

[75] Inventors: Keiji Watanabe, Isehara; Akira Oikawa, Machida; Shun-ichi Fukuyama, Yamato; Masaaki Yamagami, Kawasaki; Takahisa Namiki, Atsugi, all of Japan

[73] Assignee: Fujitsu Limited, Kanagawa, Japan

[21] Appl. No.: 614,338

[22] Filed: Nov. 15, 1990

[30] Foreign Application Priority Data

Nov. 15, 1989 [JP] Japan .................... 1-295096
Mar. 9, 1990 [JP] Japan .................... 2-56423

[51] Int. Cl.5 ............... G03F 7/027; G03F 7/038; G03F 7/075
[52] U.S. Cl. ................... 430/280; 430/270; 430/287; 556/433; 528/35; 522/148
[58] Field of Search ............ 556/433; 528/35; 522/148; 430/270, 287, 280

[56] References Cited

U.S. PATENT DOCUMENTS

| | | | |
|---|---|---|---|
| 3,296,197 | 1/1967 | Wu | 528/35 |
| 3,318,935 | 5/1967 | Sporck | 556/433 |
| 3,424,779 | 1/1969 | Wu | 556/433 |
| 4,863,833 | 9/1989 | Fukuyama et al. | 430/286 |
| 5,057,396 | 10/1991 | Tanaka et al. | 430/197 X |

FOREIGN PATENT DOCUMENTS

| | | |
|---|---|---|
| 0122398 | 10/1984 | European Pat. Off. . |
| 0432905 | 6/1991 | European Pat. Off. ....... 528/35 |
| 63-236028 | 9/1988 | Japan ....... 430/270 |
| 63-236029 | 9/1988 | Japan ....... 430/270 |

OTHER PUBLICATIONS

Chemistry of Materials, 1989, 1, pp. 572–574, Shea et al., "Aryl-Bridged Polysilsesquioxanes–New Microporous Materials".
Patent Abstracts of Japan, vol. 11, No. 60, 61 221 232, Oct. 1, 1986.
Patent Abstracts of Japan, vol. 13, No. 536, 61 221 431, Sep. 4, 1989.
Patent Abstracts of Japan vol. 14, No. 275, 2 084 435, Mar. 26, 1990.
Patent Abstracts of Japan, vol. 8, No. 93, 59 011 374 Jan. 20, 1984.
Journal of the Electrochemical Soc., vol. 137, No. 10, Oct. 1990, pp. 3223–3229 Oikawa et al., "Polysilphenylenesilocane resin as an Interlevel Dielectric for VLSI Multilevel Interconnections".

Primary Examiner—Cynthia Hamilton
Attorney, Agent, or Firm—Armstrong, Westerman, Hattori, McLeland & Naughton

[57] ABSTRACT

Novel polysilphenylenesiloxanes having a three-dimensional mesh structure of silphenylenesiloxane core surrounded by triorganosilyl groups, which have a good sensitivity to ionizing radiations such as deep ultraviolet rays, electron beams and X-rays, a high softening point of 400° C. or more, and a good resistance to $O_2$-plasma etching, and exhibit a high contrast and low swelling. These polysiphenylenesiloxanes are useful as a resist material, especially a top layer resist of the bi-level resist system and an interlevel dielectric or heat-resisting protective layer. The resist material has a high resolution because of a high contrast, low swelling and high thermal resistance thereof.

5 Claims, 14 Drawing Sheets

1 μm

1 μm

1 μm

1 μm

1 μm

1 μm

POLYSILPHENYLENESILOXANE, PRODUCTION PROCESS THEREOF, AND RESIST MATERIAL AND SEMICONDUCTOR DEVICE FORMED THEREOF

BACKGROUND OF THE INVENTION

1. Field of the Invention

The present invention relates to a novel organosilicon polymer, more particularly, it related to polysilphenylenesiloxanes. The present invention also relates to a process for the production of such an organosilicon polymer. Further, the present invention relates to a resist material, especially a resist material useful as the top layer resist in a bi-level resist system, and a process for the formation of resist patterns and process for the production of semiconductor devices using such resist material. Furthermore, the present invention relates to a semiconductor device containing an interlevel dielectric, heat-resisting protective layer or other layers consisting of the novel organosilicon polymer of the present invention, and a process for the production of such a semiconductor device.

The organosilicon polymers of the present invention have a high sensitivity to ionizing radiations such as deep ultraviolet (UV) rays, electron beams (EB) or X-rays, exhibit a high contrast (for example, $\gamma = 2.8$), low swelling upon development (for example, $0.2 \mu$ml/s at EB), and a high softening point or temperature of 400° C. or more, and accordingly, a high resolution, and further show a high resistance to oxygen ($O_2$)-plasma etching (for example, 100 times better than that of the conventional novolak resist), and thus the organosilicon polymers of the present invention can be advantageously utilized as the resist in the production of semiconductor devices and other devices.

Moreover, since these organosilicon polymers have a high thermal resistance, a superior dielectric or electrically insulating property and a good levelling function, these organosilicon polymers can be advantageously utilized in particular in the process of the formation of multilayer wiring during the production of semiconductor device such as integrated circuits (ICs), large-scale integrated circuits (LSIs) and ultra-large-scale integrated circuits (ULSIs). For example, if these polymers are used to form an interlevel dielectric in the production of multilayer wiring of semiconductor devices having a high integration density, such as ICs or LSIs, these polymers can be effectively spun-coated with a levelling of the underlying steps, to thereby form a layer having a superior dielectric property, and accordingly can remarkably increase the reliability of the resulting devices.

2. Description of the Related Art

A thin-film formation technology and photolithography are widely utilized in the production of electronic circuit devices with fine circuit patterns, for example, semiconductor devices, magnetic bubble memory devices and surface wave filter devices, and as an example thereof, the present description is of a production of wiring patterns. Namely, an electrically conductive layer, electrically insulating layer or other thin layers are formed on a substrate by conventional physical methods such as vacuum deposition or sputtering, or conventional chemical methods such as chemical vapor deposition (CVD), and after the formation of one thin layer, another thin layer is coated by a spin-coating method, for example, to form a resist coating. The resist coating is then pattern-wise exposed to radiations such as ultraviolet (UV) rays, and then developed to form resist patterns. Subsequent to the formation of resist patterns, the underlying thin layer is wet-etched or dry-etched, using the resist patterns as a masking means. Conductive fine patterns, insulating fine patterns or other fine patterns are formed on the substrate depending upon a specific property of the thin layer.

As an alternative, an electron beam exposure may be used to form resist patterns. Namely, after the formation of an electron beam-sensitive resist coating, an electron beam having a reduced beam diameter is scanned over the resist coating to conduct a direct pattern-wise exposure of the coating. The EB-exposed resist coating is then developed with a suitable developer, and superior fine resist patterns are thus obtained.

The above-described formation of wiring patterns is carried out on a single-layer resist system, but this system is not suitable for the production of recently developed semiconductor devices because, in the process for the production of recent semiconductor devices such as very-large-scale integrated circuits (VLSIs) or ULSIs, to increase a degree of integration of the circuits, conventionally the wiring is constituted as multilayer wiring, and as a result, step portions having a height of 1 to $2\mu$m are formed on a surface of the substrate. This formation of the stepped portions is a bar to the obtaining of fine resist patterns with a high accuracy. Note, the single-layer resist system can not remove this bar.

To solve the problem due to the stepped portions on the substrate surface, a bi-level resist system was developed, and is now widely utilized in the production of VLSIs, ULSIs and other devices. Generally, the bi-level resist system is carried out in the manner outlined in the accompanying drawings: FIGS. 1A to 1D.

FIG. 1A is a cross-sectional view of the resist-coated substrate. This system is started by coating an organic resin at a layer thickness of, for example, $2\mu$m, on a substrate 1, such as semiconductor substrate, with a step portion 2 such as a metallic wiring, whereby a bottom layer resist (levelling layer) 3 is formed over the substrate 1. After levelling an uneven surface of the substrate 1, a resist material having a sensitivity to exposure radiations is coated at a layer thickness of about 0.2 to $0.3\mu$m on the bottom layer resist 3, to form a top layer resist 4, and accordingly, a bi-level resist structure shown in FIG. 1A is obtained.

After the formation of the bi-level resist structure, as illustrated in FIG. 1B, the top layer resist 4 is pattern-wise exposed to exposure radiations ($e^-$). The exposure radiations used herein are, for example, ionizing radiations such as electron beams. The exposed area of the top layer resist 4 is solubilized or insolubilized depending upon a specific property (i.e., positive-working or negative-working) of the resist 4.

Since the top layer resist 4 used herein is a negative-working resist, after development of the exposed top layer resist 4 with a selected developer 4, as shown in FIG. 1C, a pattern of the top layer resist 4 is formed over the bottom layer resist 3.

After the patterning of the top layer resist, using the pattern of this resist as a masking means, the underlying bottom layer resist is selectively etched with an etching source such as oxygen plasma. As a result, as shown in FIG. 1D, the pattern of the upper layer resist 4 is transferred to the bottom layer resist.

In the above-described bi-level resist system, since the bottom layer resist can prevent an undesirable influence of the steps of the underlying substrate on the patterning, and a reflection of exposing radiations by the substrate surface, and further, the top layer resist can be used at a reduced layer thickness, it becomes possible to remarkably increase the resolution of the resist in comparison with the single-layer resist system. The top layer resist must have a high resistance to oxygen plasma, in addition to the good sensitivity and resolution required in the single-layer resist system. The resist materials satisfying these three requirements are already known, and typical examples thereof include negative-working, organosilicone-based resist materials having a high resistance to oxygen plasma, for example, polysiloxanes having a ladder structure or phenyl ring-containing polysiloxanes. Note, as described hereinafter, both the ladder-type polysiloxanes and the phenyl-containing polysiloxanes are widely-used as the top layer resist in the bi-level resist system.

As a typical example of the ladder-type polysiloxanes used as the top layer resist, there can be mentioned the pattern-forming material described in Fukuyama et al., U.S. Pat. No. 4,863,833. The described pattern-forming material consists of polysilsesquioxane having no hydroxyl group in its molecule, the polysilsesquioxane being a silylated polysilsesquioxane of the formula:

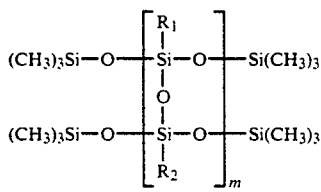

in which $R_1$ and $R_2$ are the same or different and each represents a substituted or unsubstituted alkyl group, a substituted or unsubstituted aryl group, or a substituted or unsubstituted vinyl group, and m is a positive integer in the approximate range of 25 to 4,000. The pattern-forming material has many advantages, such as high sensitivity to high energy radiations, good resistance to dry etching, a high resolution and thermal stability, but must be improved in the contrast and swelling thereof.

In addition, as a typical example of the phenyl-containing polysiloxanes used as the top layer resist, there can be mentioned the pattern-forming material described in European Patent Application No. 84101686.8 (Publication 0122398,A2). This pattern-forming material is characterized by containing a siloxane polymer having the general formula:

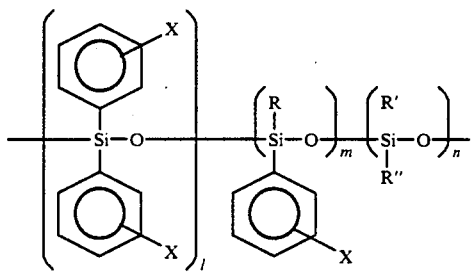

wherein R, R' and R" are the same or different and are respectively one member selected from the group consisting of hydrogen, an alkyl group and a phenyl group; X is one member selected from the group consisting of fluorine, chlorine, bromine, iodine and a $-CH_2Y$ group (wherein Y is one member selected from the group consisting of chlorine, fluorine, bromine, iodine, an acryloxyloxy group, a methacryloyloxy group, and a cinnamoyloxy group); and l, m and n are respectively 0 or a positive integer, l and m not being simultaneously 0]. Since they have a high sensitivity to high energy radiations and a good resistance to dry etching, as in the ladder-type polysiloxanes, the phenyl-containing polysiloxanes are, for example, commercially available as the "SNR" resist from Toso Corporation. Nevertheless, since they have a low sensitivity to ultraviolet rays, exhibit a large swelling upon development, and show a low contrast or gamma ($\gamma$) value (for example, $\gamma=1.2$ to 1.6 for the SNR resist), it is difficult to clearly resolve a narrow space pattern such as that sandwiched between wide line patterns in the formation of line and space patterns. Especially, such a difficulty is increased if the desired space pattern is very fine and has a width of 0.5$\mu$m or less. To contribute the fine fabrication of the VLSIs and increase through-put, there is a need for the provision of an improved high resolution resist material having a high sensitivity and resistance to oxygen plasma, exhibiting a less swelling upon development, and showing a high contrast.

The organosilicon polymer can be used for other purposes, in addition to the use thereof as a resist. For example, it is well-known that a silicon-containing polymer having a relatively low molecular weight produced by hydrolyzing tetraalkoxysilane and condensation-polymerizing the hydrolyzed product, i.e., inorganic SOG (spin-on-glass), is an organosilicon polymer useful in the production of semiconductor devices, and the production of such an SOG is well-known. Further, it is well-known that such an SOG can be used as an interlevel dielectric in semiconductor devices having a multilayer wiring structure.

The interlevel dielectric is essentially positioned in the semiconductor devices having a multilayer wiring structure, because two or more wiring layers of the devices must be electrically insulated from each other. The interlevel dielectric is generally produced by applying a dielectric layer onto the previously formed first wiring layer. After application of the dielectric layer, to ensure an electrical connection between the upper and lower wiring layers, throughholes are formed in the dielectric layer. Next, through this dielectric layer, a second wiring layer is formed. The above steps for the formation of the interlevel dielectric are repeated to complete a desired multilayer wiring structure. Currently, many types of the materials are used as the interlevel dielectric-providing material, and typical examples of such interlevel dielectric-providing materials include inorganic materials such as silicon dioxide, silicon nitride and phosphosilicate glass (PSG) (produced through a vapour phase deposition from reaction gases such as silane gas and oxygen gas), polymeric insulating materials such as polyimide or silicone resin, or a laminate of these materials. Nevertheless, the fine fabrication of wiring patterns is still progressing, and thus there is a need for the provision of an even more improved interlevel dielectric-providing material, to thereby increase the reliability of the resulting devices.

In the multilayer wiring, a surface of the semiconductor substrate supporting a first wiring layer has many concaves and convexes due to the presence of the wiring, and when an interlevel dielectric is formed from, for example, inorganic materials such as SiO₂, over this wiring layer-supporting substrate, the resulting interlevel dielectric exactly reproduces the concaves and convexes of the underlying substrate. These concaves and convexes on the substrate surface may cause disconnections, an insufficient insulation, and other defects in the wiring formed over the underlying substrate. Therefore, a need arose for the development of an electrically insulating material which can level the concaves and convexes of the substrate, when applied over the substrate.

To satisfy the above requirement, two methods were suggested. In one method, a levelled surface of the interlevel dielectric is obtained by using a specific production process of the insulating layer such as an etching back method or bias sputtering method, and in another method a levelled surface is obtained by spin-coating the selected resin. The resin coat method is most preferable, because it is the simplest of the two processes, and further, the process of this resin coat method is simplified if the resin is not baked immediately after spin-coating, but is baked after spin-coating and a formation of throughholes for communicating the upper and lower wiring layers. Unfortunately, conventionally used resins or polymeric insulating materials such as polyimide or silicon resin are not suitable for such a simplified process, because it includes a thermal processing under elevated temperature conditions of 400° C. and more, and when subjected to the temperature of 400° C. or more, the conventional resins are often oxidized or thermally decomposed, or are cracked, since a distortion is induced in the resulting interlevel dielectric due to the oxidation or decomposition of the same, or other causes. Therefore, there is a need for the provision of an improved heat-resistant resinous material which is not affected by the thermal processing.

In addition, the interlevel dielectric should have a low dielectric constant. Namely, if the interlevel dielectric has a low dielectric constant it becomes possible to shorten a delay time of the wiring and thereby provide a high-speed device. Unfortunately, conventionally used inorganic materials such as SiO₂, Si₃N₄ and PSG have a high dielectric constant of 4.0 or more, and therefore, such high dielectric constant must be reduced. On the other hand, the inorganic SOG provides a product having a composition similar to that of SiO₂ upon thermal processing, and therefore, it is difficult to obtain a reduced dielectric constant.

SUMMARY OF THE INVENTION

In view of the above-described drawbacks of the prior art organosilicon polymers, one object of the present invention is to provide a novel organosilicon polymer which is useful in the fields of semiconductor devices and other devices.

Another object of the present invention is to provide a process for the production of such a novel organosilicon polymer.

Another object of the present invention is to provide a high resolution resist material having a high sensitivity and resistance to oxygen plasma, a low swelling upon development and a high contrast, and further is particularly useful as a top layer resist in the bi-level resist system.

A further object of the present invention is to provide a process for the formation of resist patterns, which process enables the production of fine patterns on a substrate having steps, i.e., concaves and convexes.

A still further object of the present invention is to provide a semiconductor device containing one or more layers having superior characteristics such as a heat resistance and electrical insulation, and which do not reproduce concaves and convexes, if any, on the underlying substrate.

Yet another object of the present invention is to provide a semiconductor device containing a superior interlevel dielectric and/or heat-resisting protective layer.

Other objects of the present invention will be easily understood from the preferred embodiments of the present invention described hereinafter.

The inventors have made an intensive study of a plurality of organosilicon polymers, to attain the above-described objects, and found that, if the organosilicon polymers have a three-dimensional mesh structure (not the ladder structure of the conventional organosilicon polymers), more particularly, a structure which consists of a rigid, three-dimensional, silphenylenesiloxane core surrounded by functional groups such as triorganosilyl groups, the above objects can be attained. The novel organosilicon polymer developed by the inventors is polysilphenylenesiloxane, and the important characteristics thereof are, for example:

(1) a high sensitivity to ionizing radiations such as deep ultraviolet (UV) rays, electron beams (EB) and X-rays;

(2) a high contrast (for example, $\gamma = 2.8$);

(3) a low swelling upon development (for example, 0.2 $\mu$ml/s when used as the EB resist);

(4) a high resolving power;

(5) a high softening temperature (400° C. or more); and (6) a high resistance to oxygen plasma (for example, selectivity over the novolak resist of 100, i.e., 100 times better than the resistance to O₂-plasma etching of the novolak resist).

Note, the name of this novel polysilphenylenesiloxane (Three-dimensional Polysilphenylenesiloxane) is abbreviated as TSPS hereinafter.

In one aspect thereof, the present invention resides in a polysilphenylenesiloxane represented by the following structural formula (I):

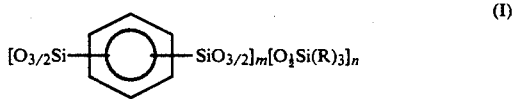

(I)

in which

R may be the same or different, and represents a hydrogen atom or a monovalent hydrocarbon group, and m and n each represent a positive integer; the polysilphenylenesiloxane having a three-dimensional mesh structure of a silphenylenesiloxane core surrounded by triorganosilyl groups, and a weight-average molecular weight of 1,000 to 5,000,000.

In another aspect thereof, the present invention resides in a process for the production of the polysilphenylenesiloxane represented by the above structural formula (I), which process comprises hydrolyzing an organic silicon compound of the following formula (II):

$$\begin{array}{c} R_2 \quad R_3 \\ R_1-\bigcirc-R_4 \\ R_6 \quad R_5 \end{array} \quad (II)$$

in which $R_1$ to $R_6$ may be the same or different, and each represents a hydrogen atom, monovalent hydrocarbon group, trichlorosilyl group or trialkoxysilyl group, with the proviso that at least two of these substituents represent a trichlorosilyl and/or trialkoxysilyl group, followed by a dehydrated condensation polymerization of the resulting hydrolyzed product.

In still another aspect thereof, the present invention resides in a process for the production of the polysilphenylenesiloxane represented by the above structural formula (I), in which the above-described hydrolyzation and condensation polymerization steps are repeated, and then the resulting product of the dehydrated condensation polymerization is reacted with triorganosilane of the following formula:

$(R)_3 SiX$ in which

R is as defined above, and X represents a halogen atom, a cyano group, an isocyanate group or an isothiocyanate group;

hexaorganodisilazane of the following formula:

$(R)_3 SiNHSi (R)_3$ in which

R is as defined above; hexaorganodisiloxane of the following formula:

$(R)_3 SiOSi (R)_3$ in which

R is as defined above; or a mixture thereof, to thereby substitute the hydrogen atom of the remaining silanol group(s) of said product, which did not react during the dehydrated condensation polymerization, with triorganosilyl group of the following formula:

$(R)_3 Si-$ which

R is as defined above.

Still another aspect of the present invention resides in a process for the production of the polysilphenylenesiloxane represented by the above structural formula (I), in which the above-described hydrolyzation and condensation polymerization steps are repeated, and then the resulting product of the dehydrated condensation polymerization is reacted with triorganosilane of the following formula:

$(R)_3 SiX$ in which

R and X are as defined above;

hexaorganodisilazane of the following formula:

$(R)_3 SiNHSi (R)_3$ in which

R is as defined above;

hexaorganodisiloxane of the following formula:

$(R)_3 SiOSi (R)_3$ in which

R is as defined above; or a mixture thereof, with the proviso that at least 5% or more of the sum of $R_1$ to $R_6$ of the formula (II) and R is a halogenated lower alkyl group or a halogenated aryl group, to thereby substitute the hydrogen atom of the remaining silanol group(s) of said product, which did not react during the dehydrated condensation polymerization, with a triorganosilyl group of the following formula:

$(R)_3 Si-$ in which

R is as defined above.

Also, another aspect of the present invention resides in a process for the production of the polysilphenylenesiloxane represented by the above structural formula (I), which comprises dissolving triorganosilane of the following formula:

$(R)_3 SiX$ in which

R and X are as defined above;

hexaorganodisilazane of the following formula:

$(R)_3 SiNHSi (R)_3$ in which

R is as defined above;

hexaorganodisiloxane of the following formula:

$(R)_3 SiOSi (R)_3$ in which

R is as defined above; or a mixture thereof in an organic solvent; and to the thus obtained solution, gradually adding an organic silicon compound of the following formula (II):

$$\begin{array}{c} R_2 \quad R_3 \\ R_1-\bigcirc-R_4 \\ R_6 \quad R_5 \end{array} \quad (II)$$

in which $R_1$ to $R_6$ are as defined above, in the presence of water.

Further, another aspect of the present invention resides in a resist material which comprises the polysilphenylenesiloxane represented by the above structural formula (I). The resist material of the present invention is preferably negative-working, and is used as a top layer resist in the bi-level resist system.

Furthermore, another aspect of the present invention resides in a process for the formation of resist patterns, which comprises the steps of:

applying a resist martial which comprises the polysilphenylenesiloxane of the above structural formula (I), onto a surface of the substrate;

selectively exposing the resulting resist coating to ionizing radiations such as deep UV rays, EB and X-rays to obtain a desired latent image pattern therein; and developing the latent image pattern in the patternwise exposed resist coating to selectively remove the unexposed resist coating.

In the pattern formation process of the present invention, preferably, if the substrate has stepped portions, i.e., concaves and convexes, on a surface thereof, two types of resists are sequentially applied onto the substrate to form a bi-level resist structure, wherein the bottom layer resist is formed from resist materials having a levelling function, and the top layer resist is formed from the polysilphenylenesiloxane of the above structural formula (I), and the pattern of the top layer resist is transferred to the underlying bottom layer resist.

In this connection, in another aspect thereof, the present invention relates to a process for the production of semiconductor devices, in which the resist patterns obtained according to the pattern formation process of the present invention are used as a masking means, when the underlying substrate is intended to be selectively etched to produce the devices. A dry etching process is preferably used.

Still another aspect of the present invention resides in a semiconductor device which comprises a semiconductor substrate and at least one layer thereof applied, the layer consisting of polysilphenylenesiloxane of the above structural formula (I). The TSPS layer may be in contact with the substrate, or may be apart from the substrate. The TSPS layer may be used as any functional layer in the devices, but preferably is used as an interlevel dielectric for multilayer wiring and/or as a heat-resisting protective layer. The present invention also resides in a process for the production of such a semiconductor device.

DESCRIPTION OF THE PREFERRED EMBODIMENTS

Figure 1A:
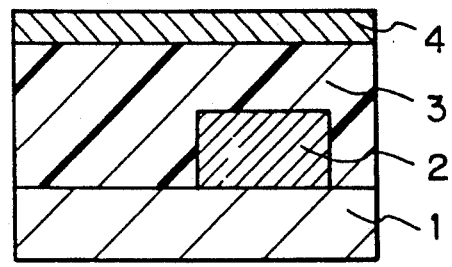
FIGS. 1A to 1D are cross-sectional views showing, in sequence, the fabrication steps of the bi-level resist system.
Figure 1B:
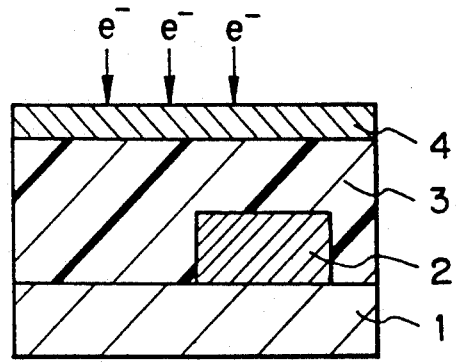
Figure 1C:
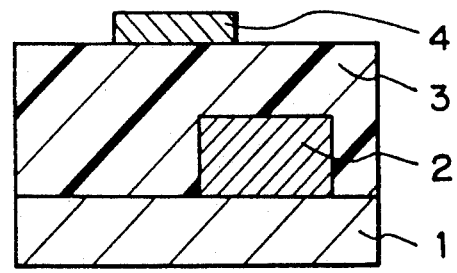
Figure 1D:
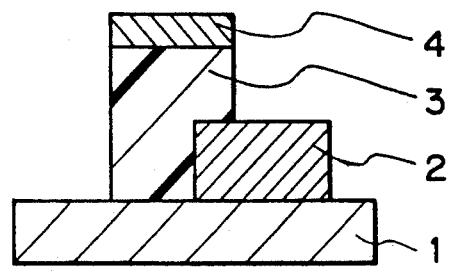

First, the present invention will be described with reference to the organosilicon polymer TSPS; particularly the structures and functions thereof.

Since the molecular structure thereof is very similar to the randomly crosslinked gel, in comparison to the prior art polymers having a linear or ladder structure, the organosilicon polymer TSPS of the present invention can be rapidly gelated with a low level of crosslinking, and thus can exhibit a high contrast. Further, since the molecular skeleton thereof contains a benzene ring introduced therein, it is possible to remarkably limit the movement of the atoms constituting the TSPS, and therefore, it is possible to inhibit a swelling of the TSPS upon development, to a negligible level, in contrast with that of the prior art linear or ladder polymers. Based on these structures and functions, the TSPS of the present invention can clearly resolve space patterns of 1 μm or less, but the prior art negative-working resists based on the organosilicon polymers can not exhibit such an excellent resolving power.

Further, by suitably selecting the functional groups, i.e., triorganosilyl groups, in the TSPS molecule, it is possible to control the radiations to which the TSPS has a high sensitivity. The inventors have found that the TSPS of the present invention has a high sensitivity to ionizing radiations such as excimer lasers, deep ultraviolet rays, electron beams and X-rays, in addition to lights such as visible light and ultraviolet light. Moreover, since it has a high silicon content in a skeleton thereof, the TSPS has a sufficiently high resistance to oxygen plasma.

Furthermore, the organosilicon polymer TSPS of the present invention has a good solubility in substantially all commercially available organic solvents, including mixtures thereof, and therefore, can be advantageously coated onto a surface of the substrate by conventional spin coaters. This means that the TSPS can be applied to the substrate having concaves and convexes on a surface thereof, to easily level such an uneven surface of the substrate. The substrate may or may not be the semiconductor substrate, and may or may not contain circuits or other elements fabricated thereon. In this connection, it should be noted that the term "substrate" is used herein in a broad sense, and therefore, covers a wide variety of substrates including those described above.

Furthermore, the organosilicon polymer TSPS of the present invention exhibits a low dielectric constant because of the presence of many organic radicals in the resulting layer or coating of the TSPS, in addition to a high heat resistance. Especially, the low dielectric constant is superior to that of the prior art inorganic SOG materials. Accordingly, the TSPS can be advantageously used as an interlevel dielectric in the production of the semiconductor devices, to thereby contribute to a speeding up of the operation speed of the devices without causing a breakage of the layer itself. Especially, the TSPS of the present invention, in which at least 5% of the sum of $R_1$ to $R_6$ of the above formula (II) and R of the above formula (I) is a halogenated lower alkyl group and/or a halogenated aryl group, is highly sensitive to ionizing radiations, especially electron beams and X-rays, and therefore, can be used to form negative resist patterns and to form throughholes in the absence of the overlying resist mask.

Figure 2:
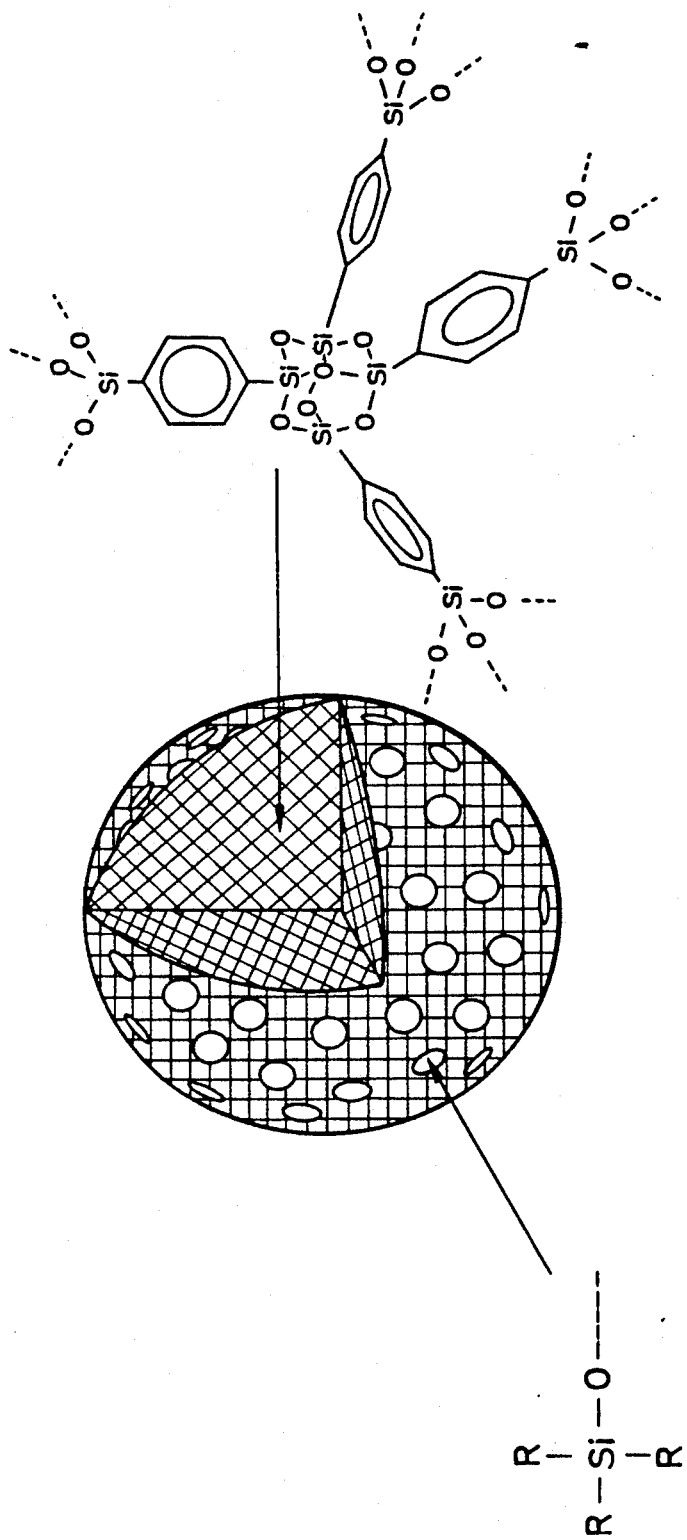
FIG. 2 illustrates a model of the molecular structure of the organosilicon polymer TSPS of the present invention.

The above-described functions of the present invention will be further understood with reference to the accompanying drawings, particularly, the model of the molecular structure of the organosilicon polymer TSPS of the present invention illustrated in FIG. 2, and others.

FIG. 2 is a model chart showing the molecular structure of the TSPS of the present invention. As illustrated, the TSPS is constituted from a core of silphenylene and functional groups, i.e., triorganosilyl groups, surrounding the silphenylene core. The TSPS is more rigid than the prior art linear or ladder organosilicon polymers, because it has bulky aromatic rings introduced into the three-dimensional mesh core to correct the Si-O bond angle. The advantages of this rigidity are an improved contrast, suppressed swelling, and improved thermal stability.

As previously mentioned, the TSPS according to the present invention is synthesized by hydrolyzing the organosilicon compound of the above-described formula (II), followed by subjecting the hydrolyzation product to a dehydrated condensation polymerization in the presence of an acid catalyst. After this core polymerization, residual silanol groups around the silphenylene core are terminated with triorganosilyl groups (for example, triorganochlorosilane).

The synthesis of this TSPS is described with reference to the following reaction schema. Note, in this synthesis process, hexafunctional monomers were used as a starting material.

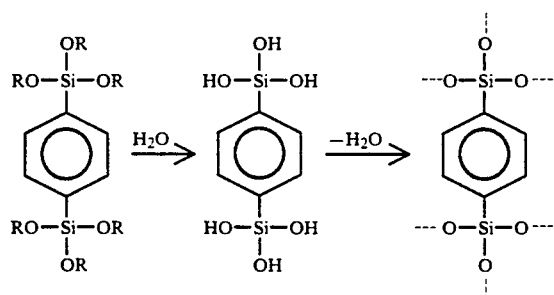

In this connection, the synthesis of the prior art ladder-type polymer (ladder SPS) from the tetrafunctional monomers is described with reference to the following reaction schema:

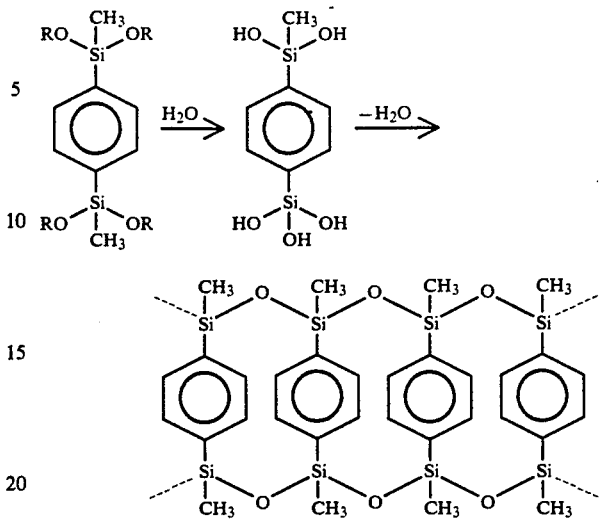

Figure 3:
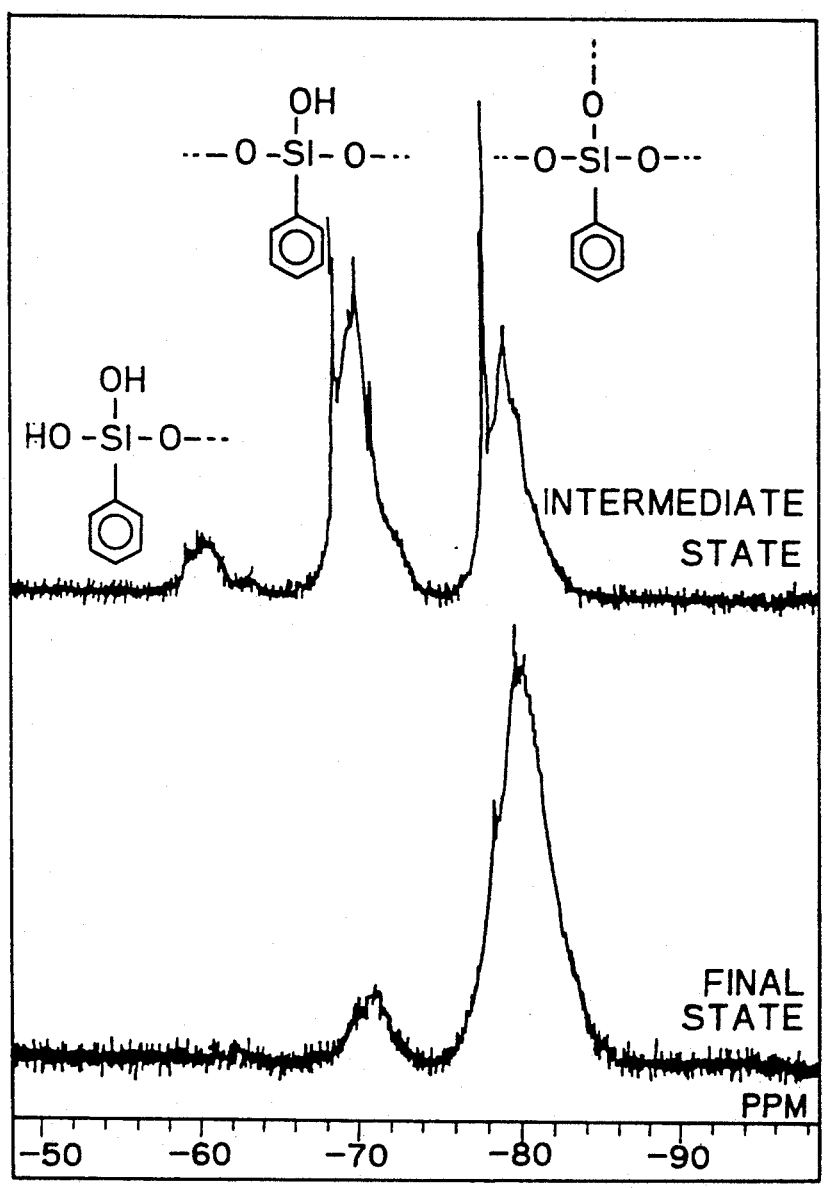
FIG. 3 is a graph showing the $^{29}$Si-NMR spectra of the TSPS.
Figure 4:
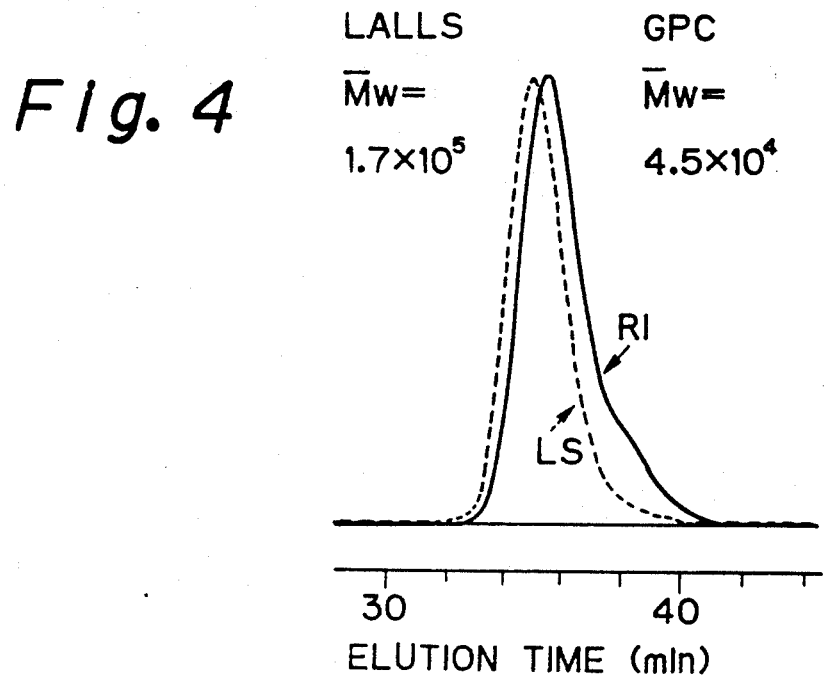
FIG. 4 is a graph showing the GPC-LALLS chromatogram of the TSPS.
Figure 5:
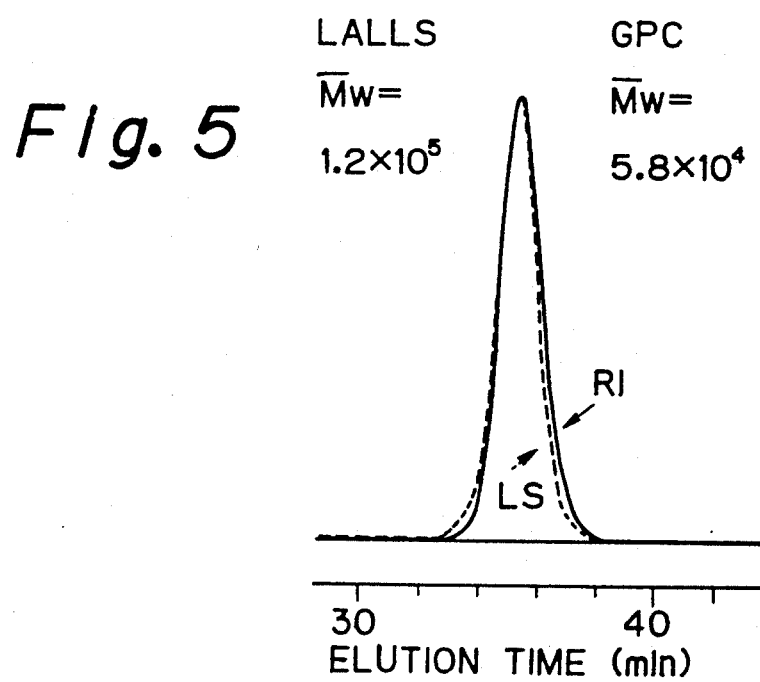
FIG. 5 is a graph showing the GPC-LALLS chromatogram of the ladder SPS.

To study the above-described synthesis of the TSPS, the inventors evaluated the structures of the TSPS in an intermediate state and in a final state by $^{29}$Si-NMR spectra (model GX500, JEOL) and GPC-LALLS chromatograms (model HLC-8020, LS-8000, TOSOH), and the results are plotted in FIGS. 3, 4 and 5. Note, GPC-LALLS is an abbreviation of gel-permeation chromatography equipped with a low-angle laser light scattering photometer.

In the intermediate state of synthesis (see, FIG. 3), the $^{29}$Si-NMR spectra of the TSPS showed two broad peaks at $-60$ and $-70$ ppm, and indicated that there are residual SiOH and Si(OH)$_2$ groups in the molecule of the TSPS. As the synthesis advanced, silanol groups were dehydrated, and in the final state of the synthesis (see, also FIG. 3), peaks due to the silanol groups were almost completely eliminated.

FIGS. 4 and 5 show GPC-LALLS chromatograms of the TSPS and ladder SPS, respectively. The elution curves in these figures were obtained by a LALLS photometer (LS) and refractometer (RI). The LS peak top of the TSPS, as shown in FIG. 4, shifts to the higher side from the RI peak top, but as shown in FIG. 5, the LS peak top of the ladder SPS substantially corresponds to the RI peak top thereof.

The weight average molecular weights ($\overline{Mw}$) of the TSPS and ladder SPS, determined by the conventional GPC (calibrated with polystyrene) and GPC-LALLS, are summarized in the follow Table 1.

TABLE 1

| Polymer | Conventional GPC | GPC-LALLS |
|---|---|---|
| TSPS | $4.5 \times 10^4$ | $1.7 \times 10^5$ |
| ladder SPS | $5.8 \times 10^4$ | $1.2 \times 10^5$ |

The data in this table indicates that the $\overline{Mw}$ of the TSPS, determined by the GPC-LALLS, is higher than that of the ladder SPS, whereas the Mw of the TSPS, determined by the conventional GPC, is lower than that of the ladder SPS. This suggests that the Mw of the TSPS is higher than that of the ladder SPS, although the molecular size of the TSPS is smaller than that of the ladder SPS. Accordingly, it is considered that the molecule of the TSPS has a structure such as a closely packed three-dimensional mesh.

Next, to make a comparison of the EB sensitivity and resistance to $O_2$ plasma between the TSPS and ladder SPS, the inventors determined these characteristics in the following manner. Namely, the TSPS was dissolved in methylisobutylketone (MIBK) and the resulting resist solution was spun-coated at a layer thickness of $0.2\mu m$ on the previously coated and hard-baked bottom layer resist (phenolnovolak resin; "MP-1300" commercially available from Shipley Co.) having a layer thickness of $1.0\mu m$. The thus obtained top layer resist was prebaked at 80° C. for 20 minutes, and after the formation of the bi-level resist, to evaluate a sensitivity of the TSPS to electron beams, the TSPS resist was exposed to electron beams at an acceleration voltage of 20 kV by an electron beam lithography system (model ELS-3300, ELIONIX). The exposure dose was controlled by changing the exposure time.

To evaluate a resistance of the TSPS to $O_2$ plasma, the TSPS resist patterns obtained after the EB exposure and development were transferred to the bottom layer resist (MP-1300) by oxygen-reactive ion etching ($O_2$-RIE) by an etching system (model DEM-451, ANELVA). The $O_2$-RIE process was carried out at an oxygen pressure of 2.6 Pa, $O_2$ gas flow rate of 10 sccm, and an applied power density of 0.16 W/cm$^2$.

Figure 6:
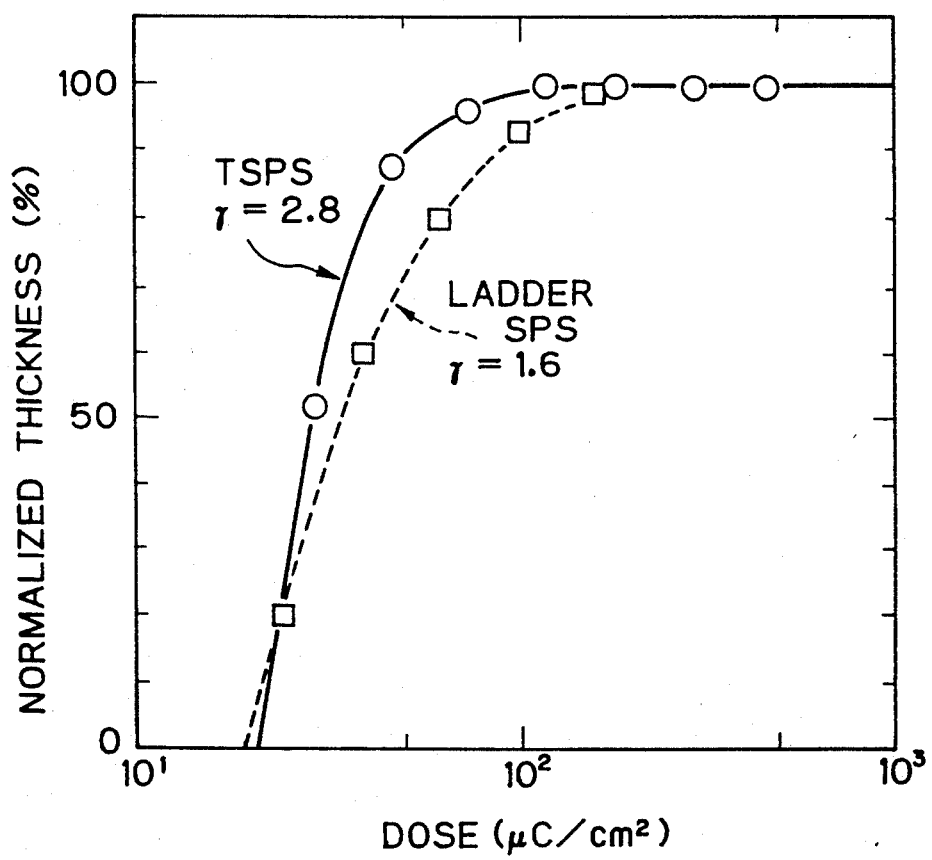
FIG. 6 is a graph showing the EB sensitivity of the TSPS and ladder SPS.
Figure 7:
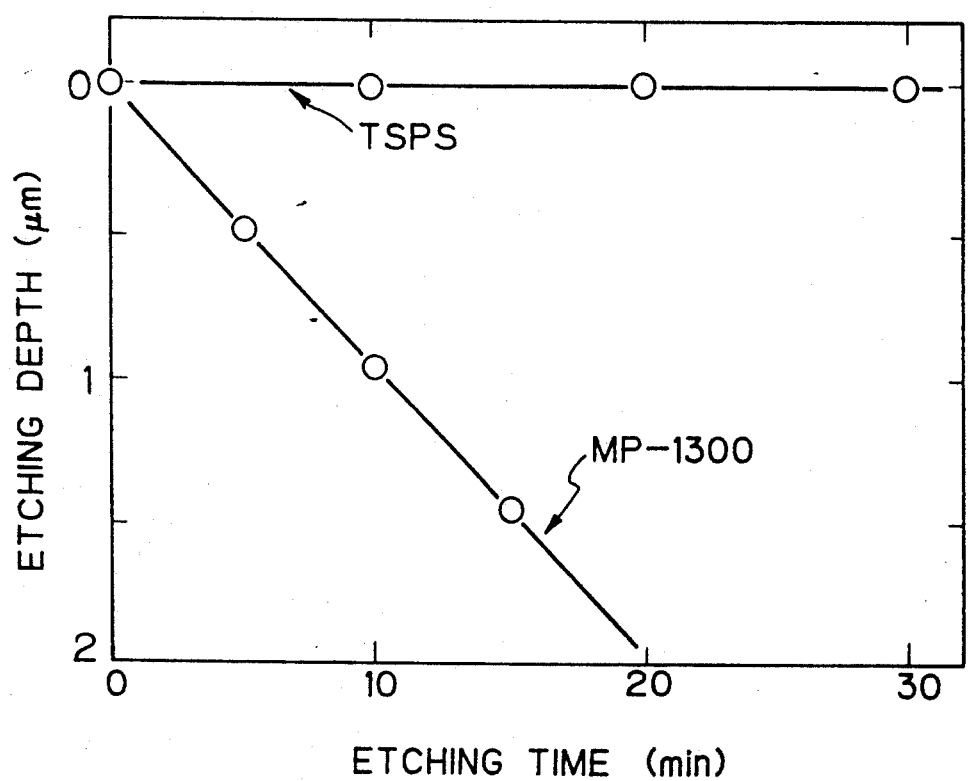
FIG. 7 is a graph showing the etch rate of the TSPS and ladder SPS with regard to the O$_2$-RIE.

The above-described procedures for determining the EB sensitivity and resistance to $O_2$ plasma were repeated with regard to the ladder SPS, and the results are plotted in FIGS. 6 and 7.

FIG. 6 shows EB sensitivity curves for the TSPS having a dispersivity ($\overline{M}w/\overline{M}n$) of 1.6, compared to the ladder SPS having the same dispersively. The introduced functional groups are methyl for both the TSPS and the ladder SPS. A variation of the film thickness was measured by the $\alpha$-step (Tencor Instruments, US) while changing the EB dose. The gamma ($\gamma$) value of the TSPS obtained from the sensitivity curve of FIG. 6 is about 2.8, and the $\gamma$ value of the ladder SPS is about 1.6. Namely, for the TSPS, the contrast obtained is higher than that of the conventional siloxane negative resists, such as the linear and ladder types. In addition, for the TSPS, the EB dose giving a remaining 50% resist thickness is 28 $\mu C/cm^2$. Note, producing more sensitive functional groups such as a chloromethyl groups would produce an even higher sensitivity.

FIG. 7 is a graph showing the etching rates at which the upper layer resist (TSPS) and the bottom layer resist (hard-baked MP-1300) were etched in an oxygen plasma, respectively. The TSPS resist was etched at a rate of about 10 Å/min, and the MP-1300 resist was etched at a rate of about 1000 Å/min. With regard to the resistance to oxygen plasma, this indicates the TSPS resist has a selectivity over the MP-1300 (novolak resist) of 100, i.e., the TSPS's resistance to oxygen plasma is 100 times better than that of the novolak resist.

Figure 8A:
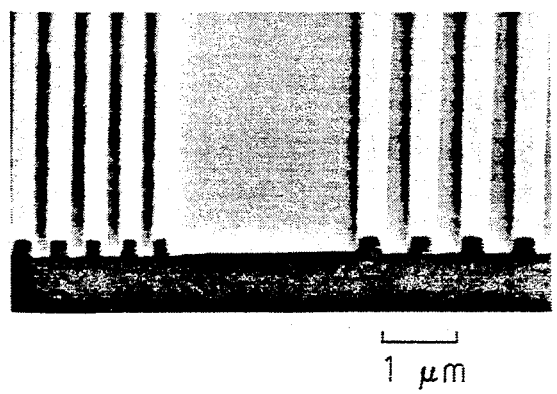
FIGS. 8A and 8B are electron micrographs of the patterned TSPS top layer resist.
Figure 8B:
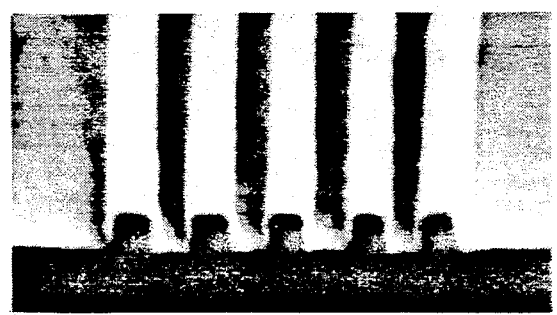

FIGS. 8A and 8B are electron micrographs (SEM) of the 0.2 $\mu m$ line & space TSPS patterns obtained by EB exposing and developing the top layer resist (TSPS) on the bottom layer resist (hard-baked MP-1300). These micrographs show that a fine rectangular profile was accurately resolved, i.e., a swelling of the top layer resist upon development was effectively suppressed as a function of the three-dimensional molecular structure of the TSPS.

Figure 9A:
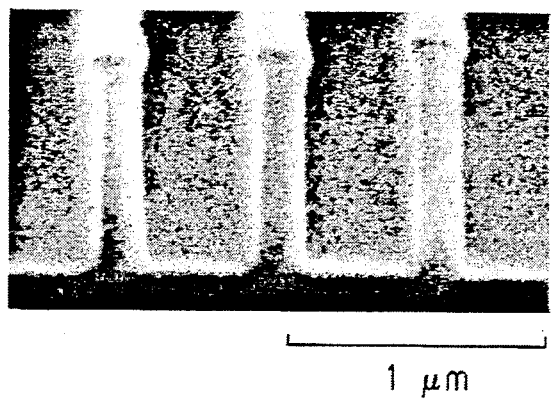
FIGS. 9A and 9B are electron micrographs of the patterned TSPS/MP-1300 bi-level resist.
Figure 9B:
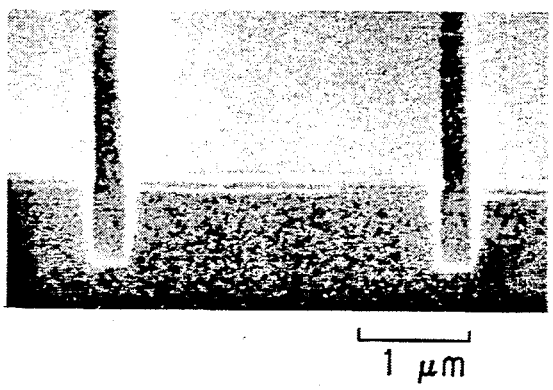

FIGS. 9A and 9B are electron micrographs of the bi-level resist patterns obtained with the TSPS/MP-1300 bi-level resist system. FIG. 9A shows that the isolated TSPS resist patterns having a width of 0.2 $\mu m$ were accurately transferred to the underlying MP-1300 resist, without thermal deformation, by $O_2$-RIE. Similarly, FIG. 9B shows that the 0.3 $\mu m$ space patterns of TSPS were accurately transferred to the underlying MP-1300 resist.

Figure 10:
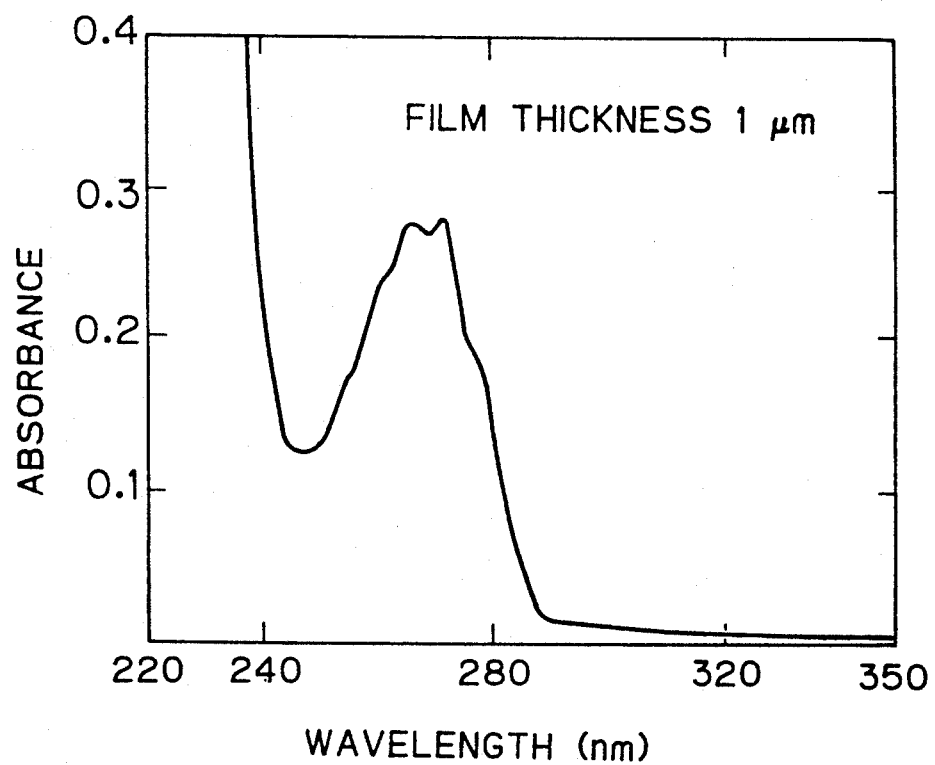
FIG. 10 is a graph showing the UV-absorption characteristic of the TSPS.

Also, the inventors evaluated the usefulness of the TSPS as a deep UV resist. First, the ultraviolet (UV) absorption of TSPS was determined in the conventional manner to obtain the UV absorption spectrum of FIG. 10. The UV spectrum of FIG. 10 indicates that, since the TSPS contains a silphenylene core that absorbs deep UV rays, it becomes possible to use the TSPS as the deep UV resist when suitable functional groups are introduced into the molecule of the TSPS.

Figure 11:
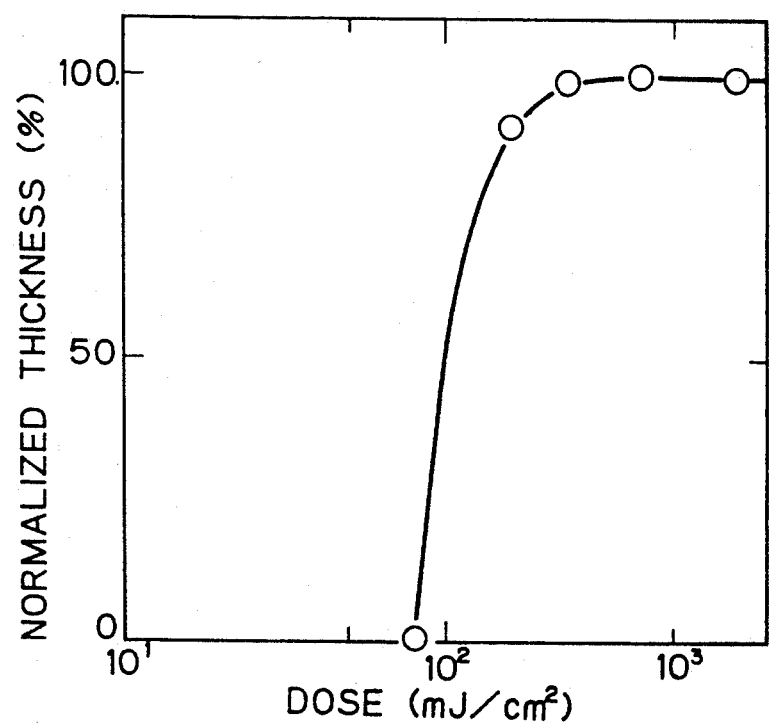
FIG. 11 is a graph showing the deep UV sensitivity of the TSPS.

FIG. 11 shows the deep UV sensitivity curve for the TSPS having vinyl/phenyl functional groups. To obtain this sensitivity curve, the TSPS/MP-1300 bi-level resist system was produced in the manner previously described with regard to the determination for the EB sensitivity and resistance to $O_2$ plasma. After a formation of the bi-level resist system, the TSPS resist was exposed to a Xe-Hg lamp with a band pass filter at 248 nm. The resolution was evaluated by 1:1 contact exposure, followed by spin-developing of the exposed resist in a mixture of alcohols for 30 seconds. The graph of FIG. 11 indicates that the exposure dose of deep UV giving a remaining 50% resist thickness is 100 mJ/cm$^2$.

Figure 12A:
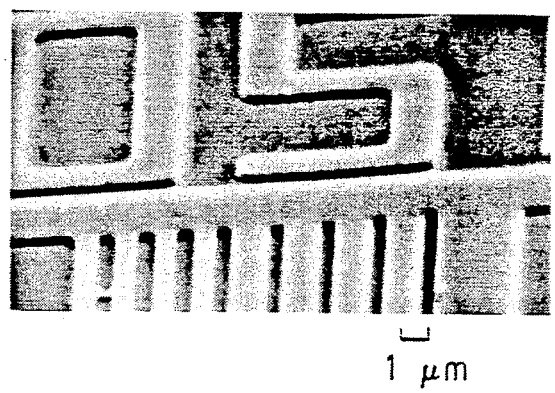
FIGS. 12A and 12B are electron micrographs of the patterned TSPS top layer resist.
Figure 12B:
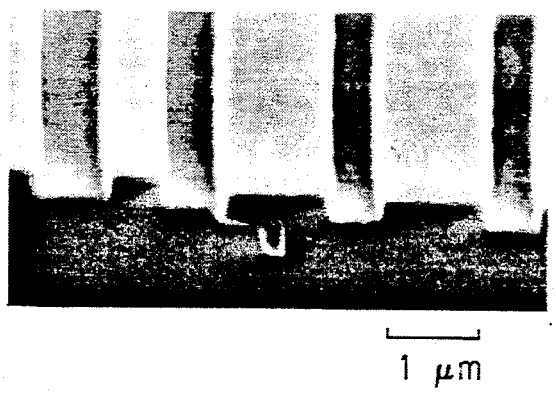

FIGS. 12A and 12B are electron micrographs of the 0.5 $\mu m$ space patterns of TSPS obtained by deep UV exposing and developing the top layer resist (TSPS) on the bottom layer resist (hard-baked MP-1300). These micrographs show that 0.5 $\mu m$ space patterns with almost vertical side walls were accurately delineated.

As previously mentioned, polysilphenylenesiloxane (TSPS), i.e., the organosilicone polymer of the present invention, is represented by the structural formula (I) described above; in which formula R represents a hydrogen atom or a monovalent hydrocarbon group. Preferably, the monovalent hydrocarbon group includes a lower alkyl group, a halogenated lower alkyl group, a lower alkenyl group, an aryl group, a halogenated aryl group and a similar group. In addition, in contrast to the prior art organosilicon polymers of the linear and ladder types, the organosilicon polymer of the present invention contains the following ball-like skeleton:

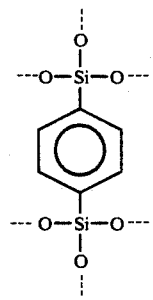

in a molecule thereof.

The organosilicon polymer of the present invention, as understood from the above descriptions, includes first, second and third organosilicon polymers. The "first organosilicon polymer" is obtained by hydrolysing the organic silicon compound of the formula (II), followed by a dehydrated condensation polymerization of the resulting hydrolyzed product. The "second organosilicon polymer" is similar to the first organosilicon polymer, with the proviso that the hydrogen atom of the silanol group(s) in the polymer is further substituted by a triorganosilyl group of the formula: $(R)_3Si-$ in which R is as defined above. The "third organosilicon polymer" is similar to the second organosilicon polymer, with the proviso that at least 5% of the sum of the substituents $R_1$ to $R_6$ and R in the above formulae is a halogenated lower alkyl group or a halogenated aryl group.

The third organosilicon polymer, if compared with the second organosilicon polymer, has similar characteristics, can be produced in accordance with similar production processes, and can exhibit a similar usefulness, but the former has an additional characteristic in that it has a high sensitivity to ionizing radiations such as electron beams and X-rays, because of the presence of the halogenated alkyl or aryl group. Note, the "halogenated lower alkyl" used herein is intended to mean any lower alkyl groups substituted by halogen atom(s), preferably halogen-substituted $C_1$-$C_3$ alkyl, more preferably, $-CH_2Cl$, $-CHCl_2$, $-C_2H_4Cl$, $-C_2H_3Cl_2$ and $-C_2H_2Cl_3$. The "halogenated aryl" used herein is intended to mean any halogen-substituted aromatic compounds, preferably $-C_6H_4Cl$ and $-C_6H_3Cl_2$.

As previously described, each of the first, second and third organosilicon polymers according to the present invention can be produced by different methods. For example:

The first organosilicon polymer can be produced as follows. Namely, the organic silicon compound of the formula (II) is dissolved in one or more solvents, and the solution is hydrolyzed at a moderate temperature in the presence of water, and if necessary a catalyst, followed by a condensation polymerization. In the organic silicon compound as the starting material, the substituents $R_1$ to $R_6$ in the formula (II) satisfy the requirement that at least two of these substituents are a trichlorosilyl and/or trialkoxysilyl group. Preferably, two or three of these substituents are a trichlorosilyl and/or trialkoxysilyl group, and the remaining substitutents are hydrogen. Further, when two of the trichlorosilyl and/or trialkoxysilyl group are contained in total on the benzene ring of the formula (II), preferably from the viewpoint of an ease of synthesis, they are substituted in a para-position rather than the ortho or metha position. Furthermore, in view of a control of the polymerization process, preferably two or more of the substituents $R_1$ to $R_6$ are the same substituent, i.e., a trialkoxysilyl group, especially a trimethoxysilyl group or triethoxysilyl group.

The second organosilicon polymer can be produced from the first organosilicon polymer. Namely, the first organosilicon polymer is reacted with triorganosilane of the following formula:

$(R)_3 SiX$ in which
R and X are as defined above;

hexaorganodisilazane of the following formula:

$(R)_3 SiNHSi (R)_3$ in which
R is as defined above;
hexaorganodisiloxane of the following formula:

$(R)_3 SiOSi(R)_3$ in which
R is as defined above; or a mixture thereof to thereby substitute the hydrogen atom of the remaining silanol group(s) which did not react during the dehydrated condensation polymerization, with triorganosilyl group of the following formula:

$(R)_3 Si-$ in which
R is as defined above.

Alternatively, the second organosilicon polymer can be produced in accordance with the following method. Namely, the triorganosilane of the following formula:

$(R)_3 SiX$ in which
R and X are as defined above;
hexaorganodisilazane of the following formula:

$(R)_3 SiNHSi (R)_3$ in which
R is as defined above;
hexaorganodisiloxane of the following formula:

$(R)_3 SiOSi (R)_3$ in which
R is as defined above; or a mixture thereof is dissolved in an organic solvent, followed by a gradual addition of the organic silicon compound of the formula (II) in the presence of water.

Although not expected by those skilled in this art, the thus-obtained organosilicon polymer of the present invention ideally is a ball-like resin having a three-dimensional random structure, and, especially, the second organosilicon polymer ideally contains a ball-like skeleton structure surrounded by triorganosilyl groups.

In addition, the third organosilicon polymer can be produced in accordance with the following method. Namely, the organic silicon compound of the formula (II) is dissolved in one or more solvents, and the solution is hydrolyzed at a moderate temperature in the presence of water, and if necessary a catalyst, followed by a condensation polymerization. After the condensation polymerization, the obtained organosilicon polymer is reacted with triorganosilane of the following formula:

$(R)_3 SiX$ in which
R and X are as defined above with the proviso that at least 5% or more of the sum of $R_1$ to $R_6$ in the formula (II) and R is a halogenated lower alkyl or a halogenated aryl;
hexaorganodisilazane of the following formula:

$(R)_3 SiNHSi (R)_3$ in which
R is as defined above;
hexaorganodisiloxane of the following formula:

$(R)_3 SiOSi (R)_3$ in which

R is as defined above; or a mixture thereof to thereby substitute the hydrogen atom of the remaining silanol group(s) of said polymer, which did not react during the dehydrated condensation polymerization, with triorganosilyl group of the following formula:

(R)$_3$ Si— in which

R is as defined above.

The third organosilicon polymer also can be produced in accordance with the following method. Namely, triorganosilane of the following formula:

(R)$_3$ SiX in which

R and X are as defined above; hexaorganodisilazane of the following formula:

(R)$_3$ SiNHSi (R)$_3$ in which

R is as defined above;

hexaorganodisiloxane of the following formula:

(R)$_3$ SiOSi (R)$_3$ in which

R is as defined above; or a mixture thereof is dissolved in an organic solvent; followed by gradually adding the organic silicon compound of the formula (II) to the obtained solution in the presence of water.

The thus-obtained third polymer, as for the above first and second polymers, ideally is a ball-like resin having a three-dimensional random structure, and more particularly, a ball-like skeleton structure surrounded by triorganosilyl groups.

Some examples of organosilicon polymers considered to be especially useful in the practice of the present invention include:

Organosilicon polymers having a weight average molecular weight of 1,000 to 5,000,000 obtained by hydrolyzing the organic silicon compound of the formula (II) in which R$_1$ to R$_6$ are selected from the substituents such as —H, —CH$_3$, —C$_2$H$_5$, —SiCl$_3$, —Si(OCH$_3$)$_3$ and —Si(OC$_2$H$_5$)$_3$, followed by dehydrated condensation polymerization (namely, first organosilicon polymer). In view of the heat resistance, preferably at least two of the substituents R$_1$ to R$_6$ in this polymer are selected from trichlorosilyl and trialkoxysilyl groups such as —SiCl$_3$, —Si(OCH$_3$)$_3$ and —Si(OC$_2$H$_5$)$_3$, and the remaining substituent is a hydrogen atom.

Organosilicon polymers which correspond to the first organosilicon polymer, but in which the hydrogen atom of the silanol group(s) in the polymer is substituted with triorganosilyl groups of the formula:

(R)$_3$ Si— in which R is as defined above (namely, second organosilicon polymer). In this second polymer, since some or all of the silanol groups are substituted with the triorganosilyl groups, a variation of the resist characteristics due to crosslinking is avoided when the polymer is used as the resist material. Namely, the resist consisting of this second polymer has a high stability. Moreover, when the second polymer is used as an interlevel dielectric in the multilayer wiring structure, it is superior to the first polymer in that the formation of cracks in the resulting dielectric layer is effectively prevented. This is because the second polymer is not easily distorted upon crosslinking during heating, because some or all of the silanol groups thereof have been substituted with triorganosilyl groups, but the first polymer contains many silanol groups on the molecule thereof, and therefore, is easily distorted upon crosslinking. Further, since the second polymer contains more organic groups than the first polymer, it can exhibit a low dielectric constant. Note, as previously described, the substituent R in the formula (I) which may be the same or different represents a hydrogen atom or a monovalent hydrocarbon group, and preferably the monovalent hydrocarbon group includes alkyl groups such as methyl, ethyl and hexyl; haloalkyl groups such as 1-chloro-methyl and 1-chloroethyl; aralkyl groups such as 2-phenylethyl and 2-phenylpropyl; alkoxy groups such as methoxy and ethoxy; alkenyl groups such as vinyl and allyl; aryl groups such as phenyl and tolyl; haloaryl groups such as parachlorophenyl; and epoxy groups. More particularly, when the described polymer is intended to be used as the interlevel dielectric, preferably the substituent R contains as many aryl groups as possible, because the aryl group provides the best heat resistance, among the described examples of the R substituents. Suitable aryl groups include, for example, triphenylsilyl, methyldiphenylsilyl and dimethylphenylsilyl.

The organosilicon polymer TSPS according to the present invention is useful as a resist material, and therefore, the resist material of the present invention can be advantageously used in the formation of resist patterns and the production of semiconductor devices.

The resist material of the present invention is prepared by dissolving the above-described organosilicon polymer in organic solvents such as alcohols, ketones and ethers. The thus-obtained resist solution is preferably filtered through a filter having a mesh size of about 0.1 $\mu$m, and a concentration thereof is controlled so that a preferable layer thickness of 0.1 to 0.5 $\mu$m is obtained upon spin coating. After control of the concentration, the resist solution is coated over any suitable substrate, i.e., material to be processed or fabricated, by any conventional coating method, including spin coating. The resist solution is preferably coated as a top layer resist in the bi-level resist system.

FIGS. 13A to 13D are cross-sectional views showing, in sequence, the production of Si-gate PMOS in which the resist material of the present invention is used as the top layer resist in the bi-level resist system. Note, in the illustrated production of the PMOS, the polysilicon layer to be selectively etched through the mask of the patterned resist has an uneven surface, due to the presence of the stepped portions on the substrate.

Figure 13A:
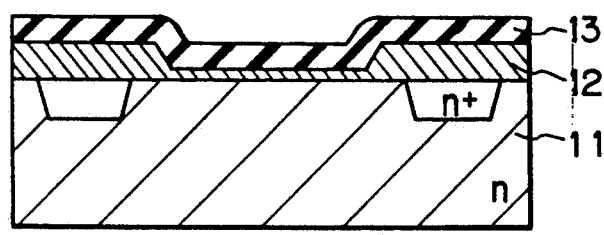
FIGS. 13A to 13D are cross-sectional views showing, in sequence, the fabrication steps of the Si-gate PMOS.

Accordingly, first, as shown in FIG. 13A, a polysilicon layer 13 is formed on a n-type silicon substrate 11 by, for example, a chemical vapor deposition (CVD) process. The polysilicon layer 13 is intended to be fabricated to form gate electrodes. The structure of FIG. 13A is obtained after the following steps and the above-described formation of the polysilicon layer:

(1) Formation of a silicon oxide layer 12 upon thermal oxidation of the silicon substrate 11;

(2) Channel stop diffusion;

(3) Formation of a field oxide layer; and
(4) Formation of a gate oxide layer.

Figure 13B:
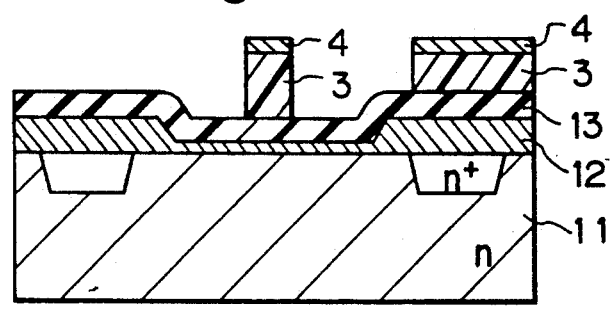

After formation of the polysilicon layer, as shown in FIG. 13B, resist patterns consisting of a bottom layer resist (levelling layer) 3 and a top layer resist (TSPS of the present invention) are formed over the surface of the polysilicon layer 13. The formation of these resist patterns is carried out in accordance with a conventional bi-level resist system, for example, as previously described with reference to FIGS. 1A to 1D.

Figure 13C:
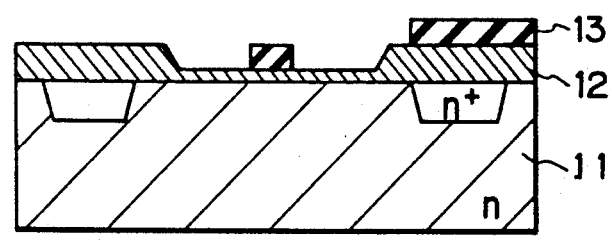

Using the resist patterns of FIG. 13B as the mask, the underlying polysilicon layer 13 is selectively etched, and as shown in FIG. 13C, a desired pattern is obtained in the polysilicon layer.

Figure 13D:
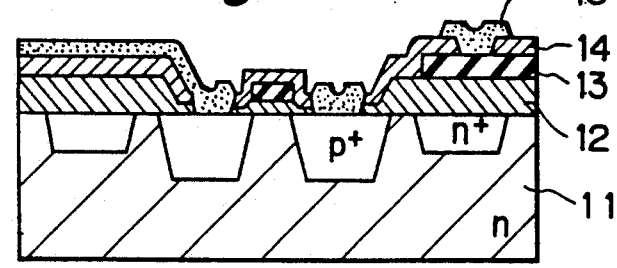

The patterning of the polysilicon layer is followed by a series of fabrication steps, such as a removal of the silicon oxide layer from the source and drain portions, source.drain diffusion, formation of a silicon oxide layer (for example, by CVD), formation of contact holes, depositing of aluminum for use as wiring, and patterning of the deposited aluminum. Accordingly, as shown in FIG. 13D, a desired Si-gate PMOS is obtained. Note, in FIG. 13D, reference numeral 14 is an interlevel dielectric ($SiO_2$), and reference numeral 15 is an aluminum wiring.

In addition to the above use as a resist material, the organosilicon polymer TSPS of the present invention can be advantageously used as functional layers in semiconductor and other devices.

Especially, the TSPS of the present invention is useful as an interlevel dielectric, and the TSPS may be used independently or in combination with a conventional inorganic layer(s) such as silicon dioxide, silicon nitride, and phosphosilicate glass (PSG), to form the interlevel dielectric.

The advantages obtained when the TSPS of the present invention is used as the interlevel dielectric are summarized as follows:

(1) High thermal resistance;
(2) Suitable for spin coating;
(3) Good levelling or planarization;
(4) Good compatibility with conventional resist;
(5) Good adhesion to $SiO_2$, PSG, and wiring metals;
(6) Low moisture absorption; and
(7) Low dielectric constant.

Moreover, when the third organosilicon polymer of the present invention is used in the formation of the interlevel dielectrics, the following important points should be noted. Namely, the third polymer usable in the formation of the interlevel dielectrics is preferably one having a weight average molecular weight of 1,000 to 5,000,000 obtained by hydrolyzing the organic silicon compound of the formula (II) in which $R_1$ to $R_6$ are selected from the substituents such as —H, —$CH_3$, —$C_2H_5$, —$CH_2Cl$, —$C_2H_4Cl$, —$SiCl_3$, —$Si(OCH_3)_3$ and —$Si(OC_2H_5)_3$, followed by dehydrated condensation polymerization, in which polymers the hydrogen atom of the silanol group(s) is substituted with triorganosilyl group of the formula:

which R is as defined above, with the proviso that, as mentioned above, at least 5% or more of the sum of the substituents $R_1$ to $R_6$ and R is a halogenated lower alkyl or a halogenated aryl. In view of the heat resistance, preferably at least two of the substituents $R_1$ to $R_6$ in these polymers are selected from trichlorosilyl and trialkoxysilyl groups such as —$SiCl_3$, —$Si(OCH_3)_3$ and —$Si(OC_2H_5)_3$, and the remaining substituent is a hydrogen atom. These polymers have a superiority over other organosilicon polymers in that, when used in the formation of the interlevel dielectrics, they substantially prevent a formation of cracks in the resulting layer. This is because the former is not easily distorted upon crosslinking during heating because some or all of the silanol groups thereof have been substituted with triorganosilyl groups, but the latter contains many silanol groups on the molecule thereof, and therefore, is easily distorted upon crosslinking. Further, since the former contains more organic groups than the latter polymer, it can exhibit a low dielectric constant. Furthermore, as previously described, the substituent R may be the same or different, and represents a hydrogen atom, a lower alkyl group, a halogenated lower alkyl group, a lower alkenyl group, an aryl group or a halogenated aryl group.

Note, to enable the production of throughholes for use in the electrical connection between the upper and lower wiring layers by only exposing the organosilicon polymers to ionizing radiations such as electron beams and X-rays, the halogenated lower alkyl and halogenated aryl groups must be contained in an amount of 5% or more of the sum of the substituents $R_1$ to $R_6$ and R. Namely, by using the described organosilicon polymers, it becomes possible to form negative patterns with the irradiation of ionizing radiations. Furthermore, the substituent R must contain an aryl or halogenated aryl group, since such a group provides the best heat resistance. A suitable substituent R includes parachlorophenyldiphenylsilyl, methyldiparaphenylsilyl and dichloromethylphenylsilyl, for example.

FIGS. 14A to 14G are cross-sectional views showing, in sequence, the production of a Si-gate NMOS in which the organosilicon polymer TSPS of the present invention is used as an interlevel dielectric.

Figure 14A:
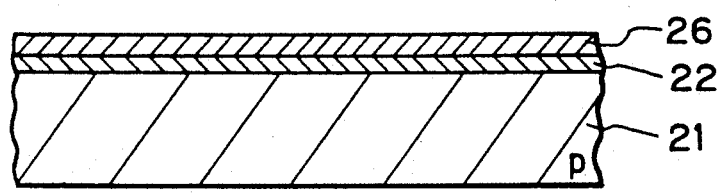
FIGS. 14A to 14G are cross-sectional views showing, in sequence, the fabrication steps of the Si-gate NMOS.
Figure 14B:
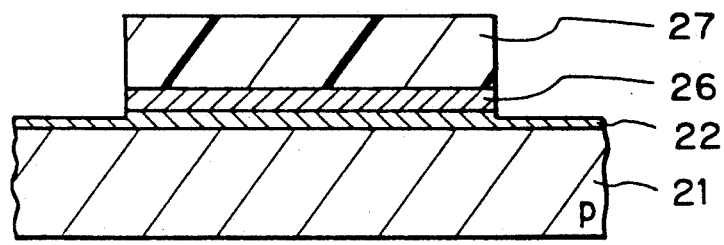
Figure 14C:
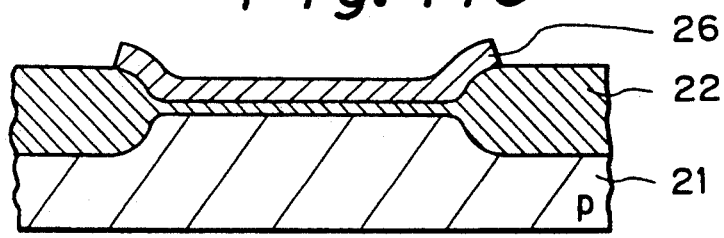

First, a field oxide layer is formed over the substrate. As shown in FIG. 14A, for use in a LOCOS, a silicon oxide ($SiO_2$) layer 22 and a silicon nitride ($Si_3N_4$) layer 26 are sequentially formed on a p-type silicon (Si) substrate 21. Next, as shown in FIG. 14B, the $Si_3N_4$ layer 26 is selectively etched in the presence of a photoresist pattern 27 as the mask, to leave the $Si_3N_4$ layer 26 in only transistor-providing areas. After removal of the photoresist pattern 27, the Si substrate 21 is wet-oxidized with a water vapor to selectively oxidize the $Si_3N_4$-free areas thereof, and as shown in FIG. 14C, a field oxide ($SiO_2$) layer 22 is thus formed on the substrate 21.

Figure 14D:
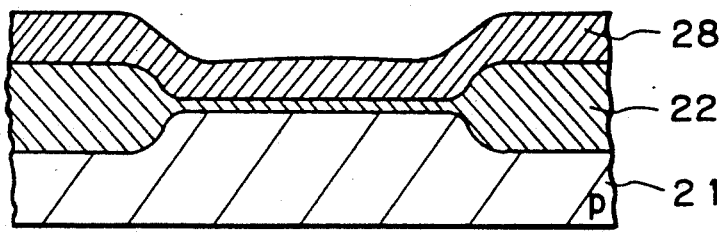

Thereafter, a silicon (Si) gate is produced. After the $Si_3N_4$ layer and the $SiO_2$ layer used in the LOCOS process are removed, the underlying Si substrate is again oxidized to form a gate oxide ($SiO_2$) layer. Then, polysilicon for use as the gate electrode is deposited over the newly formed $SiO_2$ layer, by CVD. As shown in FIG. 14D, a polysilicon (Si) layer 28 is formed over the gate $SiO_2$ layer/field $SiO_2$ layer 22, and the Si layer 28 is selectively etched to obtain a silicon (Si) gate (see, the Al gate 28 of FIG. 14E).

Figure 14E:
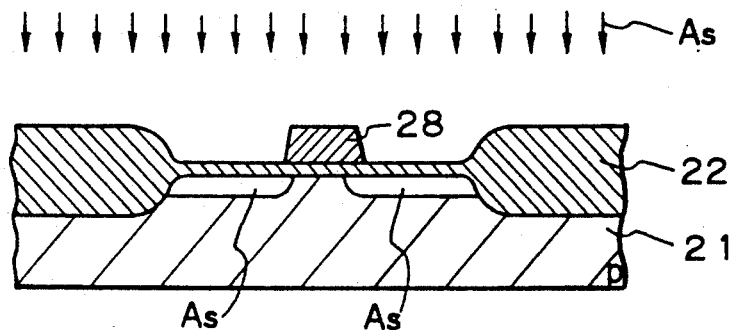
Figure 14F:
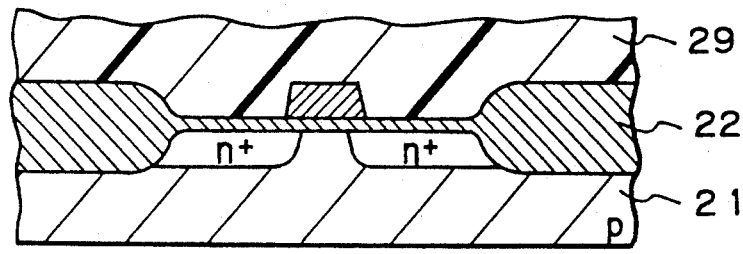

After the formation of the Si gate, a source and drain are formed. First, as shown in FIG. 14E, arsenic (As) ions are ion-implanted into the substrate 21 while using the Si gate 28 as the mask. Next, to form an interlevel dielectric, the organosilicon polymer (TSPS) of the present invention is applied to the substrate by spin coating. Since the TSPS has a levelling function, the resulting interlevel dielectric layer 29, as shown in FIG.

14F, provides a flat surface, although the underlying substrate 21 contains the field oxide layer 22 and the Si gate 28, for example. After application of the interlevel dielectric, a dry etching is carried out to form throughholes in the dielectric. These throughholes are used as holes connecting the source and drain.

Figure 14G:
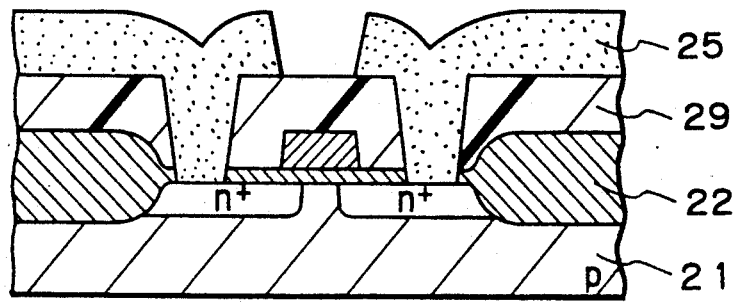

As a final step of the NMOS production, an aluminum (Al) electrode or wiring is formed. The Al electrode can be obtained, for example, by sputtering the Si-containing aluminum and then selectively etching the Al/Si layer whereby, as shown in FIG. 14G, a desired Si-gate NMOS is obtained. Note, in FIG. 14G, reference numeral 25 is the Al electrode.

The organosilicon polymer TSPS of the present invention is also useful as a heat-resisting protective layer. More particularly, the TSPS is useful as, for example, a passivation layer for protecting interfaces and wiring metals. The polymer of the present invention is not softened even at an elevated temperature, and this provides many advantages such as a good processability, low moisture adsorption and eliminates the necessity to change an etching gas when throughholes are produced, in comparison with the conventional polyimide resins.

The present invention will be further described with reference to working examples thereof.

EXAMPLE 1 (synthesis example)

16 g of 1,4-bis (trimethoxysilyl)benzene was dissolved in a mixed solvent of 50 cc of methylisobutylketone (MIBK), 25 cc of acetone and 25 cc of methanol, and the solution was stirred at a room temperature for 30 minutes, after addition of 5.4 cc of water. The solution was concentrated under a reduced pressure. A resin solution with a concentration of about 20% by weight was thus obtained.

A weight average molecular weight of the resin, determined by a gel-permeation chromatography (GPC), was $5.2 \times 10^3$ calibrated with standard polystyrene, and a dispersion thereof was 2.8.

EXAMPLE 2 (synthesis example)

16 g of 1,4-bis (trimethoxysilyl)benzene was dissolved in a mixed solvent of 50 cc of methylisobutylketone (MIBK), 25 cc of acetone and 25 cc of methanol, and the solution was stirred at a room temperature for 30 minutes, after addition of 5.4 cc of water. The solution was concentrated under a reduced pressure. A resin solution with a concentration of about 20% by weight was thus obtained. To the resin solution, 90 g of phenyldimethylchlorosilane and 90 g of pyridine were added and the mixture was stirred at 80° C. for 2 hours. After cooling, each 100 cc of MIBK and water were added, and the mixture was separated on a separating funnel to obtain an upper MIBK phase. The MIBK phase was washed with water several times, and then azeotropically distilled to remove the remaining water, Thereafter, the reaction solution was poured into a great amount of water to precipitate the resin. The resin was recovered, and freeze-dried. About 10 g of white powders were thus obtained.

A weight average molecular weight of the resin, determined by a gel-permeation chromatography (GPC), was $5.3 \times 10^3$ calibrated with standard polystyrene, and a dispersion thereof was 2.8.

EXAMPLE 3 (synthesis example)

A 500 cc, four-necked flask was charged with 40 cc of methylisobutylketone (MIBK), 25 cc of methanol, 25 cc of acetone, 50 cc of water, 5 cc of conc. hydrochloric acid, and 4.05 g of trimethylchlorosilane, and the content was stirred with heating to make a reflux state. A 15.9 g of 1,4-bis(trimethoxysilyl)benzene was dissolved in 35 cc of MIBK, and the solution was dropped to the flask for 20 minutes. The content of the flask was stirred for 60 minutes, cooled, added with each 50 cc of MIBK and water, and separated on a separating funnel to obtain an upper MIBK phase. The MIBK phase was washed with water several times, and then azeotropically distilled to remove the remaining water. Thereafter, the reaction solution was poured into a great amount of water to precipitate the resin. The resin was recovered, and freeze-dried. 12 g of white powders were thus obtained. A weight average molecular weight of the resin, determined by a gel-permeation chromatography (GPC), was $3.6 \times 10^4$ calibrated with standard polystyrene, and a dispersion thereof was 4.0.

EXAMPLE 4 (synthesis example)

Each 10 cc of trimethylchlorosilane and pyridine were added to 100 g of 4% solution of the white powders, obtained in Example 3, in MIBK, and the mixture was stirred at 80° C. for 2 hours. After cooling, each 50 cc of MIBK and water were added, and the mixture was separated on a separating funnel to obtain an upper MIBK phase.

The MIBK phase was washed with water several times, and then azeotropically distilled to remove the remaining water. Thereafter, the reaction solution was poured into a great amount of water to precipitate the resin. The resin was recovered, and freeze-dried. 4.17 g of white powders were thus obtained.

The white powders were washed with ethanol and then acetonitrile to remove low molecular weight oligomers and impurities. Finally, 2.16 g of white powders were obtained. The white powders were dissolved in a mixed solvent of isopropyl alcohol and ethanol at 70° C., and its temperature was reduced under the controlled conditions to precipitate the resin, after the solution was taken in a thermostatic chamber. The precipitated resin was fractionated with regard to a molecular weight distribution thereof. A weight average molecular weight of the resin, determined by a gel-permeation chromatrography (GPC), was $4.5 \times 10^4$ calibrated with standard polystyrene, and a dispersion thereof was 1.6.

EXAMPLE 5 (synthesis example)

Each 10 cc of vinyldimethylchlorosilane and pyridine were added to 100 g of 4% solution of the white powders, obtained in Example 3, in MIBK, and the mixture was stirred at 80° C. for 2 hours. After cooling, each 50 cc of MIBK and water were added, and the mixture was separated on a separating funnel to obtain an upper MIBK phase.

The MIBK phase was washed with water several times, and then azeotropically distilled to remove the remaining water. Thereafter, the reaction solution was poured into a great amount of water to precipitate the resin. The resin was recovered, and freeze-dried. 4.0 g of white powders were thus obtained. The white powders were washed with ethanol and then acetonitrile to remove low molecular weight oligomers and impurities. Finally, 1.24 g of white powders were obtained. The white powders were dissolved in isopropyl alcohol at 70° C., and its temperature was reduced under the controlled conditions to precipitate the resin, after the solution was taken in a thermostatic chamber. The precipitated resin was fractionated with regard to a molecular weight distribution thereof. A weight average molecular weight of the resin, determined by a gel-permeation chromatography (GPC), was $4.2 \times 10^4$ calibrated with standard polystyrene, and a dispersion thereof was 1.5.

EXAMPLE 6 (synthesis example)

Each 10 cc of phenyldimethylchlorosilane and pyridine were added to 100 g of 4% solution of the white powders, obtained in Example 3, in MIBK, and the mixture was stirred at 80° C. for 2 hours. After cooling, each 50 cc of MIBK and water were added, and the mixture was separated on a separating funnel to obtain an upper MIBK phase.

The MIBK phase was washed with water several times, and then azeotropically distilled to remove the remaining water. Thereafter, the solution was concentrated, and a great amount of acetonitrile was added to the concentrated solution to precipitate the resin. The precipitate was filtered off, recovered, and freeze-dried. 3.1 g of white powders were thus obtained. The white powders were washed with ethanol and then acetonitrile to remove low molecular weight oligomers and impurities. Finally, 2.20 g of white powders were obtained.

The white powders were dissolved in a mixed solvent of isopropyl alcohol and MIBK at 70° C., and its temperature was reduced under the controlled conditions to precipitate the resin, after the solution was taken in a thermostatic chamber. The precipitated resin was fractionated with regard to a molecular weight distribution thereof. A weight average molecular weight of the resin, determined by a gel-permeation chromatography (GPC), was $5.4 \times 10^4$ calibrated with standard polystyrene and a dispersion thereof was 2.9.

EXAMPLE 7 (synthesis example)

A 300 cc, four-necked flask was charged with 50 cc of methylisobutylketone (MIBK), 25 cc of methanol, 25 cc of acetone, 50 cc of water, 5 cc of conc. hydrochloric acid, and 7.15 g of trivinylchlorosilane, and the content was stirred with heating to make a reflux state. 20.1 g of 1,4-bis (triethoxysilyl)benzene was dropped to the flask for 20 minutes. The content of the flask was stirred for 20 minutes, cooled, added with each 50 cc of MIBK and water, and separated on a separating funnel to obtain an upper MIBK phase. The MIBK phase was washed with water several times, and then azeotropically distilled to remove the remaining water.

Thereafter, the reaction solution was poured into a great amount of water to precipitate the resin. The resin was recovered, and freeze-dried. About 15 g of white powders were thus obtained. A weight average molecular weight of the resin, determined by a gel-permeation chromatography (GPC), was $4.1 \times 10^4$ calibrated with standard polystyrene, and a dispersion thereof was 5.6.

EXAMPLE 8 (synthesis example)

Each 10 cc of phenyldivinylchlorosilane and pyridine were added to 85 g of 14% solution of the white powders, obtained in Example 7, in MIBK, and the mixture was stirred at 80° C. for 2 hours. After cooling, each 50 cc of MIBK and water were added, and the mixture was separated on a separating funnel to obtain an upper MIBK phase.

The MIBK phase was washed with water several times, and then azeotropically distilled to remove the remaining water. Thereafter, the solution was concentrated, and a great amount of acetonitrile was added to the concentrated solution to precipitate the resin. The precipitate was filtered off, recovered, and freeze-dried. 10.4 g of white powders were thus obtained. The white powders were dissolved in a mixed solvent of isopropyl alcohol and MIBK at 70° C., and its temperature was reduced under the controlled conditions to precipitate the resin, after the solution was taken in a thermostatic chamber.

The precipitated resin was fractionated with regard to a molecular weight distribution thereof. A weight average molecular weight of the resin, determined by a gel-permeation chromatography (GPC), was $3.5 \times 10^4$ calibrated with standard polystylene, and a dispersion thereof was 1.5.

EXAMPLE 9 (synthesis example)

The procedure of the above-described Example 2 was repeated with the proviso that 90 g of chloromethylphenyldimethylchlorosilane was used in place of phenyldimethylchlorosilane.

About 10 g of white powders were thus obtained. A weight average molecular weight of the resin, determined by a gel-permeation chromatography (GPC), was $6.3 \times 10^3$ calibrated with standard polystyrene, and a dispersion thereof was 2.8.

EXAMPLE 10 (synthesis example)

A 500 cc, four-necked flask was charged with 40 cc of methylisobutylketone (MIBK), 25 cc of methanol, 25 cc of acetone, 50 cc of water, 5 cc of conc. hydrochloric acid, and 4.05 g of chloromethyldimethylsilane, and the content was stirred with heating to make a reflux state. 15.9 g of 1,4-bis(trimethoxysilyl)benzene was dissolved in 35 cc of MIBK, and the solution was dropped to the flask for 20 minutes. The content of the flask was stirred for 30 minutes, cooled, added with each 50 cc of MIBK and water, and separated on a separating funnel to obtain an upper MIBK phase. The MIBK phase was washed with water several times, and then azeotropically distilled to remove the remaining water.

Thereafter, the reaction solution was poured into a great amount of water to precipitate the resin. The resin was recovered, and freeze-dried. 12 g of white powders were thus obtained. A weight average molecular weight of the resin, determined by a gel-permeation chromatography (GPC), was $3.0 \times 10^4$ calibrated with standard polystyrene, and a dispersion thereof was 4.0.

EXAMPLE 11 (synthesis example)

Each 10 cc of vinyldimethylchlorosilane and pyridine were added to 100 g of 4% solution of the white powders, obtained in Example 10, in MIBK, and the mixture was stirred at 80° C. for 2 hours. After cooling, each 50 cc of MIBK and water were added, and the mixture was separated on a separating funnel to obtain an upper MIBK phase.

The MIBK phase was washed with water several times, and then azeotropically distilled to remove the remaining water. Thereafter, the reaction solution was poured into a great amount of water to precipitate the resin. The resin was recovered, and freeze-dried. 4.17 g of white powders were thus obtained. The white powders were washed with ethanol and then acetonitrile to remove low molecular weight oligomers and impurities. Finally, 2.16 g of white powders were obtained. The white powders were dissolved in isopropyl alcohol at 70° C., and its temperature was reduced under the controlled conditions to precipitate the resin, after the solution was taken in a thermostatic chamber.

The precipitated resin was fractionated with regard to a molecular weight distribution thereof. A weight average molecular weight of the resin, determined by a gel-permeation chromatography (GPC), was $5.2 \times 10^4$ calibrated with standard polystyrene, and a dispersion thereof was 1.7.

EXAMPLE 12 (synthesis example)

Each 10 cc of chloromethyldimethylchlorosilane and pyridine were added to 100 g of 4% solution of the white powders, obtained in Example 10, in MIBK, and the mixture was stirred at 80° C. for 2 hours. After cooling, each 50 cc of MIBK and water were added, and the mixture was separated on a separating funnel to obtain an upper MIBK phase.

The MIBK phase was washed with water several times, and then azeotropically distilled to remove the remaining water. Thereafter, the reaction solution was poured into a great amount of water to precipitate the resin. The resin was recovered, and freeze-dried. 4.0 g of white powders were thus obtained.

The white powders were washed with ethanol and then acetonitrile to remove low molecular weight oligomers and impurities. Finally, 1.24 g of white powders were obtained. The white powders were dissolved in a mixed solvent of isopropyl alcohol and ethanol at 70° C., and its temperature was reduced under the controlled conditions to precipitate the resin, after the solution was taken in a thermostatic chamber.

The precipitated resin was fractionated with regard to a molecular weight distribution thereof. A weight average molecular weight of the resin, determined by a gel-permeation chromatography (GPC), was $4.8 \times 10^4$ calibrated with standard polystyrene, and a dispersion thereof was 1.5.

EXAMPLE 13 (synthesis example)

Each 10 cc of p-chlorophenyldimethylchlorosilane and pyridine were added to 100 g of 4% solution of the white powders, obtained in Example 10, in MIBK, and the mixture was stirred at 80° C. for 2 hours. After cooling, each 50 cc of MIBK and water were added, and the mixture was separated on a separating funnel to obtain an upper MIBK phase.

The MIBK phase was washed with water several times, and then azeotropically distilled to remove the remaining water. Thereafter, the reaction solution was concentrated, and added with a great amount of acetonitrile to precipitate the resin. The resin was filtered off, recovered, and freeze-dried. 3.1 g of white powders were thus obtained.

The white powders were washed with ethanol and then acetonitrile to remove low molecular weight oligomers and impurities. Finally, 2.20 g of white powders were obtained.

The white powders were dissolved in a mixed solvent of isopropyl alcohol and MIBK at 70° C., and its temperature was reduced under the controlled conditions to precipitate the resin, after the solution was taken in a thermostatic chamber.

The precipitated resin was fractionated with regard to a molecular weight distribution thereof. A weight average molecular weight of the resin, determined by a gel-permeation chromatography (GPC), was $5.2 \times 10^4$ calibrated with standard polystyrene, and a dispersion thereof was 1.5.

EXAMPLE 14 (synthesis example)

Each 10 cc of allyldimethylchlorosilane and pyridine were added to 100 g of 4% solution of the white powders, obtained in Example 10, in MIBK, and the mixture was stirred at 80° C. for 2 hours. After cooling, each 50 cc of MIBK and water were added, and the mixture was separated on a separating funnel to obtain an upper MIBK phase.

The MIBK phase was washed with water several times, and then azeotropically distilled to remove the remaining water. Thereafter, the reaction solution was poured into a great amount of water to precipitate the resin. The resin was recovered, and freeze-dried. 4.0 g of white powders were thus obtained. The white powders were washed with ethanol and then acetonitrile to remove low molecular weight oligomers and impurities. Finally, 1.24 g of white powders were obtained. The white powders were dissolved in isopropyl alcohol at 70° C., and its temperature was reduced under the controlled conditions to precipitate the resin, after the solution was taken in a thermostatic chamber.

The precipitated resin was fractionated with regard to a molecular weight distribution thereof. A weight average molecular weight of the resin, determined by a gel-permeation chromatography (GPC), was $5.5 \times 10^4$ calibrated with standard polystyrene, and a dispersion thereof was 1.7.

EXAMPLE 15

Use as an electron beam (EB) resist

The organosilicon polymer obtained in Example 4 was dissolved in methylisobutylketone (MIBK) to prepare a 13% by weight MIBK solution thereof. The MIBK solution was filtered with a membrane filter having a mesh size of 0.1 μm to obtain a resist resin.

Thereafter, a phenolnovolak resin (MP-1300, Shipley) was spun-coated at a layer thickness of 2.0μm on a silicon substrate, and hard baked to obtain a bottom layer resist. Next, the previously prepared resist solution was spun-coated at a layer thickness of 0.2μm on the bottom layer resist, and baked at 80° C. for 20 minutes to obtain a bi-level resist. The thus obtained bi-level resist was EB-scanned at an acceleration voltage of 20 kV, developed with isopropyl alcohol for 60 seconds, and then rinsed with ethanol for 30 seconds. After baking at 80° C. for 20 minutes, the test sample was placed in a parallel plates dry etching system, and dry-etched with $O_2$ plasma (2Pa, 0.22 W/cm²) for 15 minutes to transfer the patterns of the top layer resist to the bottom layer resist.

The tested resist indicated that it has a high contrast ($\gamma = 2.3$) and can resolve space patterns of 0.3μm because of low swelling thereof. The EB exposure dose $D_{50}^{EB}$ which is a measure of EB sensitivity and means the exposure dose giving a remaining 50% resist thickness was 50 μC/cm².

EXAMPLE 16

The procedure of Example 15 was repeated with the proviso that the organosilicon polymer obtained in each of Examples 1 to 3, and Examples 5 to 14 was used in place of the organosilicon polymer of Example 4. The results showing the resolved minimum space patterns (μm) and the EB exposure dose $D_{50}^{EB}$ (μC/cm$^2$) are summarized in the following table.

TABLE 2

| Polymer of Example No. | 1 | 2 | 3 | 5 | 6 | 7 | 8 | 9 | 10 | 11 | 12 | 13 | 14 |
|---|---|---|---|---|---|---|---|---|---|---|---|---|---|
| Minimum space patterns (μm) | 0.7 | 0.7 | 0.7 | 0.4 | 0.3 | 0.8 | 0.6 | 0.6 | 0.7 | 0.4 | 0.3 | 0.4 | 0.4 |
| $D_{50}^{EB}$ (μC/cm$^2$) | 200 | 150 | 60 | 3 | 55 | 4 | 1 | 30 | 40 | 2 | 25 | 20 | 2 |

EXAMPLE 17

Use of as a photoresist

The organosilicon polymer obtained in Example 8 was dissolved in methylisobutylketone (MIBK) to prepare a 13% by weight MIBK solution thereof. The MIBK solution was filtered with a membrane filter having a mesh size of 0.1 μm to obtain a resist resin.

Thereafter, a phenolnovolak resin (MP-1300, Shipley) was spun-coated at a layer thickness of 2.0μm on a silicon substrate, and hard baked to obtain a bottom layer resist. Next, the previously prepared resist solution was spun-coated at a layer thickness of 0.2μm on the bottom layer resist, and baked at 80° C. for 20 minutes to obtain a bi-level resist. The thus obtained bi-level resist was irradiated with a pattern of deep ultraviolet (UV) rays having a wavelength of 248 nm, developed with MIBK for 60 seconds, and then rinsed with isopropyl alcohol for 30 seconds. After baking at 80° C. for 20 minutes, the test sample was placed in a parallel plates dry etching system, and dry-etched with O$_2$ plasma (2Pa, 0.22 W/cm$^2$) for 15 minutes to transfer the patterns of the top layer resist to the bottom layer resist.

The tested resist indicated that it has a high contrast (γ=2.5) and can resolve space patterns of 0.5μm because of low swelling thereof. The deep UV exposure dose $D_{50}^{DUV}$ which is a measure of deep UV sensitivity and means the exposure dose giving a remaining 50% resist thickness was 240 mJ/cm$^2$.

EXAMPLE 18

The procedure of Example 17 was repeated with the proviso that the organosilicon polymer obtained in each of Examples 5, 7, 11 and 14 was used in place of the organosilicon polymer of Example 8. The results showing the resolved minimum space patterns (μm) and the deep UV exposure dose $D_{50}^{DUV}$ (mJ/cm$^2$) are summarized in the following table.

TABLE 3

| Polymer of Example No. | 5 | 7 | 11 | 14 |
|---|---|---|---|---|
| Minimum space patterns (μm) | 0.5 | 1.0 | 0.5 | 0.5 |
| $D_{50}^{DUV}$ (mJ/cm$^2$) | 310 | 350 | 300 | 290 |

EXAMPLE 19

Use as an X-ray resist

The organosilicon polymer obtained in Example 13 was dissolved in methylisobutylketone (MIBK) to prepare a 13% by weight MIBK solution thereof. The MIBK solution was filtered with a membrane filter having a mesh size of 0.1 μm to obtain a resist resin.

Thereafter, a phenolnovolak resin (MP-1300, Shipley) was spun-coated at a layer thickness of 2.0 μm on a silicon substrate, and hard baked to obtain a bottom layer resist. Next, the previously prepared resist solution was spun-coated at a layer thickness of 0.2 μm on the bottom layer resist, and baked at 80° C. for 20 minutes to obtain a bi-level resist. The thus obtained bi-level resist was exposed through the X-ray mask to Pd Lα rays (4.37A), developed with MIBK for 60 seconds, and then rinsed with isopropyl alcohol for 30 seconds. After baking at 80° C. for 20 minutes, the test sample was placed in a parallel plates dry etching system, and dry-etched with O$_2$ plasma (2Pa, 0.22 W/cm$^2$) for 15 minutes to transfer the patterns of the top layer resist to the bottom layer resist.

The tested resist indicated that it has a high contrast (γ=2.3) and can resolve space patterns of 0.4 μm because of low swelling thereof. The X-rays exposure dose $D_{50}^{X}$ which is a measure of X-rays sensitivity and means the exposure dose giving a remaining 50% resist thickness was 350 mJ/cm$^2$.

EXAMPLE 20

The procedure of Example 19 was repeated with the proviso that the organosilicon polymer obtained in each of Examples 5 to 6, Examples 11 and 12 and Example 14 was used in place of the organosilicon polymer of Example 13. The results showing the resolved minimum space patterns (μm) and the X-rays exposure dose $D_{50}^{X}$ (mJ/cm$^2$) are summarized in the following table.

TABLE 4

| Polymer of Example No. | 4 | 5 | 6 | 8 | 11 | 12 | 14 |
|---|---|---|---|---|---|---|---|
| Minimum space patterns (μm) | 0.3 | 0.4 | 0.3 | 0.6 | 0.4 | 0.3 | 0.4 |
| $D_{50}^{X}$ (mJ/cm$^2$) | 800 | 48 | 900 | 16 | 32 | 415 | 35 |

EXAMPLE 21 (synthesis example)

A 300 cc, four-necked flask was charged with 50 cc of methylisobutylketone (MIBK), 25 cc of methanol, 25 cc of acetone, 50 cc of water, 5 cc of conc. hydrochloric acid, and 7.15 g of phenyldimethylchlorosilane, and the content was stirred with heating to make a reflux state. A 20.1 g of 1,4-bis(triethoxysilyl)benzene was dropped to the flask for 20 minutes. The content of the flask was stirred for 60 minutes, cooled, added with each 50 cc of MIBK and water, and separated on a separating funnel to obtain an upper MIBK phase. The MIBK phase was washed with water several times, and then azeotropically distilled to remove the remaining water.

Thereafter, the reaction solution was poured into a great amount of water to precipitate the resin. The resin was recovered, and freeze-dried. About 15 g of white powders were thus obtained. A weight average molecular weight of the resin, determined by a gel-permeation chromatography (GPC), was 4.1×10$^4$ calibrated with standard polystyrene, and a dispersion thereof was 5.6.

EXAMPLE 22 (synthesis example)

Each 10 cc of phenyldimethylchlorosilane and pyridine were added to 85 g of 14% solution of the white powders, obtained in Example 21, in MIBK, and the mixture was stirred at 80° C. for 2 hours. After cooling, each 50 cc of MIBK and water were added, and the mixture was separated on a separating funnel to obtain an upper MIBK phase.

The MIBK phase was washed with water several times, and then azeotropically distilled to remove the remaining water. Thereafter, the reaction solution was concentrated, and added with a great amount of acetonitrile to precipitate the resin. The resin was filtered off, recovered, and freeze-dried. A 10.4 g of white powders were thus obtained. A weight average molecular weight of the resin, determined by a gel-permeation chromatography (GPC), was $5.1 \times 10^4$ calibrated with standard polystyrene, and a dispersion thereof was 5.3.

EXAMPLE 23 (synthesis example)

A 500 cc, four-necked flask was charged with 40 cc of methylisobutylketone (MIBK), 25 cc of methanol, 25 cc of acetone, 50 cc of water, 5 cc of conc. hydrochloric acid, and 4.05 g of 1,3-dichloromethyl-1,1,3,3-tetramethyldi-siloxane, and the content was stirred with heating to make a reflux state. A 15.9 g of 1,4-bis(trimethoxysilyl)benzene was dissolved in 35 cc of MIBK, and the solution was dropped to the flask for 20 minutes. The content of the flask was stirred for 30 minutes, cooled, added with each 50 cc of MIBK and water, and separated on a separating funnel to obtain an upper MIBK phase. The MIBK phase was washed with water several times, and then azeotropically distilled to remove the remaining water.

Thereafter, the reaction solution was poured into a great amount of water to precipitate the resin. The resin was recovered, and freeze-dried. 12 g of white powders were thus obtained. A weight average molecular weight of the resin, determined by a gel-permeation chromatography (GPC), was $1.2 \times 10^4$ calibrated with standard polystyrene, and a dispersion thereof was 4.0.

EXAMPLE 24 (synthesis example)

Each 10 cc of chloromethyldimethylchlorosilane and pyridine were added to 100 g of 4% solution of the white powders, obtained in Example 23, in MIBK, and the mixture was stirred at 80° C. for 2 hours. After cooling, each 50 cc of MIBK and water were added, and the mixture was separated on a separating funnel to obtain an upper MIBK phase.

The MIBK phase was washed with water several times, and then azeotropically distilled to remove the remaining water. Thereafter, the reaction solution was poured into a great amount of water to precipitate the resin. The resin was recovered, and freeze-dried. 4.17 g of white powders were thus obtained.

The white powders were washed with ethanol and then acetonitrile to remove low molecular weight oligomers and impurities. Finally, 2.16 g of white powders were obtained. A weight average molecular weight of the resin, determined by a gel-permeation chromatography (GPC), was $4.3 \times 10^4$ calibrated with standard polystyrene, and a dispersion thereof was 3.5.

EXAMPLE 25 (synthesis example)

Each 10 cc of vinyldimethylchlorosilane and pyridine were added to 100 g of 4% solution of the white powders, obtained in Example 23, and the mixture was stirred at 80° C. for 2 hours. After cooling, each 50 cc of MIBK and water were added, and the mixture was separated on a separating funnel to obtain an upper MIBK phase.

The MIBK phase was washed with water several times, and then azeotropically distilled to remove the remaining water. Thereafter, the reaction solution was poured into a great amount of water to precipitate the resin. The resin was recovered, and freeze-dried. 4.0 g of white powders were thus obtained.

The white powders were washed with ethanol and then acetonitril to remove low molecular weight oligomers and impurities. Finally, 1.24 g of white powders were obtained. A weight average molecular weight of the resin, determined by a gel-permeation chromatography (GPC), was $4.8 \times 10^4$ calibrated with standard polystyrene, and a dispersion thereof was 4.2.

EXAMPLE 26 (synthesis example)

Each 10 cc of p-chlorophenyldimethylchlorosilane and pyridine were added to 100 g of 4% solution of the white powders, obtained in Example 23, in MIBK, and the mixture was stirred at 80° C. for 2 hours. After cooling, each 50 cc of MIBK and water were added, and the mixture was separated on a separating funnel to obtain an upper MIBK phase.

The MIBK phase was washed with water several times, and then azeotropically distilled to remove the remaining water. Thereafter, the solution was concentrated, and a great amount of acetonitril was added to the concentrated solution to precipitate the resin. The precipitate was filtered off, recovered, and freeze-dried. 3.1 g of white powders were thus obtained.

The white powders were washed with ethanol and then acetonitril, to remove low molecular weight oligomers and impurities. Finally, 2.20 g of white powders were obtained. A weight average molecular weight of the resin, determined by a gel-permeation chromatography (GPC), was $4.4 \times 10^4$ calibrated with standard polystyrene, and a dispersion thereof was 2.7.

EXAMPLE 27

The resin solution obtained in Example 1 was diluted with methylisobutylketone (MIBK) to make a concentration of 15% by weight. The thus obtained resin solution was spun-coated at 2000 rpm for 45 seconds on a silicon substrate. The silicon substrate had a semiconductor element and first polysilicon wiring layer formed on a surface thereof, and the polysilicon wiring layer had a thickness of 1 μm, minimum line width of 1 μm and minimum space width of 1.5 μm. After spin coating, the resin coating was dried at 80° C. for 20 minutes to remove the solvent, and then heated at 450° C. for 60 minutes in an atmosphere.

After this heat treatment, it was found that the substrate surface has a step of about 0.3 μm, namely, large steps due to the wiring layer were levelled with the resin coating. Thereafter, throughholes were formed, and aluminum wiring was applied to the upper and lower wiring layers, and then, to form a protective layer, a phosphosilicate glass (PSG) was deposited at a layer thickness of 1 μm in accordance with the atomospheric pressure CVD system. A window for connecting electrodes was opened to produce a semiconductor device. The semiconductor device was tested with regard to a heating test at 450° C. for one hour in an atomosphere, and a heat cycle test in which a temperature change of from −65° C. to 150° C. was repeated ten times. No failure of the device was observed.

EXAMPLE 28

The white powders obtained in each of Examples 2 and 4 were dissolved in methylisobutylketone (MIBK) to make a resin solution having a concentration of 25% by weight. The thus obtained resin solution was spun-coated at 2000 rpm for 45 seconds on a silicon substrate.

The silicon substrate had a semiconductor element and first polysilicon wiring layer formed on a surface thereof, and the polysilicon wiring layer had a thickness of 1 μm, minimum line width of 1 μm and minimum space width of 1.5 μm. After spin coating, the resin coating was dried at 80° C. for 20 minutes to remove the solvent, and then heated at 400° C. for 60 minutes.

After this heat treatment, it was found that the substrate surface has a step of about 0.2 μm, namely, large steps due to the wiring layer were levelled with the resin coating. Thereafter, throughholes were formed, a second aluminum wiring was applied, and then, to form a protective layer, a phosphosilicate glass (PSG) was deposited at a layer thickness of 1 μm in accordance with the atmospheric pressure CVD system. A window for connecting electrodes was opened to produce a semiconductor device. The semiconductor device was tested with regard to a heating test at 450° C. for one hour in a nitrogen atmosphere, and a heat cycle test in which a temperature change of from −65° C. to 150° C. was repeated ten times. No failure of the device was observed.

EXAMPLE 29

The white powders obtained in each of Examples 3 and were dissolved in methylisobutylketone (MIBK) to make a resin solution having a concentration of 15% by weight. The thus obtained resin solution was spun-coated at 2000 rpm for 45 seconds on a silicon substrate. The silicon substrate had a semiconductor element and first polysilicon wiring layer formed on a surface thereof, and the polysilicon wiring layer had a thickness of 1 μm, minimum line width of 1 μm and minimum space width of 1.5 μm. After spin coating, the resin coating was dried at 80° C. for 20 minutes to remove the solvent, and then heated at 400° C. for 60 minutes.

After this heat treatment, it was found that the substrate surface has a step of about 0.3 μm, namely, large steps due to the wiring layer were levelled with the resin coating. Thereafter, throughholes were formed, a second aluminum wiring was applied, and then, to form a protective layer, a phosphosilicate glass (PSG) was deposited at a layer thickness of 1 μm in accordance with the atmospheric pressure CVD system. A window for connecting electrodes was opened to produce a semiconductor device. The semiconductor device was tested with regard to a heating test at 450° C. for one hour in a nitrogen atmosphere, and a heat cycle test in which a temperature change of from −65° C. to 150° C. was repeated ten times. No failure of the device was observed.

EXAMPLE 30

The white powders obtained in Example 6 were dissolved in methylisobutylketone (MIBK) to make a resin solution having a concentration of 25% by weight. The thus obtained resin solution was spun-coated at 2000 rpm for 45 seconds on a silicon substrate. The silicon substrate had a semiconductor element and first polysilicon wiring layer formed on a surface thereof, and the polysilicon wiring layer had a thickness of 1 μm, minimum line width of 1 μm and minimum space width of 1.5 μm. After spin coating, the resin coating was dried at 80° C. for 20 minutes to remove the solvent, and then heated at 400° C. for 60 minutes in an atmosphere.

After this heat treatment, it was found that the substrate surface has a step of about 0.1 μm, namely, large steps due to the wiring layer were levelled with the resin coating. Thereafter, throughholes were formed, a second aluminum wiring was applied, and then, to form a protective layer, a phosphosilicate glass (PSG) was deposited at a layer thickness of 1 μm in accordance with the atmospheric pressure CVD system. A window for connecting electrodes was opened to produce a semiconductor device. The semiconductor device was tested with regard to a heating test at 450° C. for one hour in a nitrogen atmosphere, and a heat cycle test in which a temperature change of from −65° C. to 150° C. was repeated ten times. No failure of the device was observed.

EXAMPLE 31

The white powders obtained in Example 22 were dissolved in methylisobutylketone (MIBK) to make a resin solution having a concentration of 25% by weight. The thus obtained resin solution was spun-coated at 2000 rpm for 45 seconds on a silicon substrate. The silicon substrate had a semiconductor element and first polysilicon wiring layer formed on a surface thereof, and the polysilicon wiring layer had a thickness of 1 μm, minimum line width of 1 μm and minimum space width of 1.5 μm. After spin coating, the resin coating was dried at 80° C. for 20 minutes to remove the solvent, and then heated at 400° C. for 60 minutes in an atmosphere.

After this heat treatment, it was found that the substrate surface has a step of about 0.1 μm, namely, large steps due to the wiring layer were levelled with the resin coating. Thereafter, throughholes were formed, a second aluminum wiring was applied, and then, to form a protective layer, a phosphosilicate glass (PSG) was deposited at a layer thickness of 1 μm in accordance with the atmospheric pressure CVD system. A window for connecting electrodes was opened to produce a semiconductor device. The semiconductor device was tested with regard to a heating test at 450° C. for one hour in a nitrogen atmosphere, and a heat cycle test in which a temperature change of from −65° C. to 150° C. was repeated ten times. No failure of the device was observed.

EXAMPLE 32

Determination of dielectric constant

A lower aluminum layer was deposited on a 2-inch silicon substrate in accordance with the CVD process. Thereafter, the resin obtained in Example 4 was spun-coated at a layer thickness of 0.5 μm or 1.0 μm, and dried at 80° C. for 20 minutes to remove the solvent. The resin coating was heated at 400° C. for 60 minutes. An upper aluminum layer was then deposited in accordance with the CVD process, and the aluminum layer was patterned at a size of 1 μmφ, 2 μmφ, 3 μmφ, 4 μmφ and 5 μmφ. An electrode was formed connecting the upper and lower aluminum layers, and a capacitance was determined at an alternating voltage of 20 KV. The results in terms of relative dielectric constant, determined in each layer thickness and determination point, were in the range of from 2.9 to 3.1, satisfactory values.

EXAMPLE 33

The white powders obtained in Example 9 was dissolved in methylisobutylketone (MIBK) to make a resin solution having a concentration of 25% by weight. The thus obtained resin solution was spun-coated at 2000 rpm for 45 seconds on a silicon substrate. The silicon substrate had a semiconductor element and first polysilicon wiring layer formed on a surface thereof, and the polysilicon wiring layer had a thickness of 1 μm, minimum line width of 1 μm and minimum space width of 1.5 μm. After spin coating, the resin coating was dried at 80° C. for 20 minutes to remove the solvent, patternwise exposed to X-rays and after formation of throughholes, heated at 400° C. for 60 minutes.

After this heat treatment, it was found that the substrate surface has a step of about 0.2 μm, namely, large steps due to the wiring layer were levelled with the resin coating. Thereafter, a second aluminum wiring was applied, and then, to form a protective layer, a phosphosilicate glass (PSG) was deposited at a layer thickness of 1 μm in accordance with the atmospheric pressure CVD system. A window for connecting electrodes was opened to produce a semiconductor device. The semiconductor device was tested with regard to a heating test at 450° C. for one hour in a nitrogen atmosphere, and a heat cycle test in which a temperature change of from −65° C. to 150° C. was repeated ten times. No failure of the device was observed.

EXAMPLE 34

The white powders obtained in Example 23 were dissolved in methylisobutylketone (MIBK) to make a resin solution having a concentration of 15% by weight. The thus obtained resin solution was spun-coated at 2000 rpm for 45 seconds on a silicon substrate. The silicon substrate had a semiconductor element and first polysilicon wiring layer formed on a surface thereof, and the polysilicon wiring layer had a thickness of 1 μm, minimum line width of 1 μm and minimum space width of 1.5 μm. After spin coating, the resin coating was dried at 80° C. for 20 minutes to remove the solvent, pattern-wise exposed to X-rays and, after formation of throughholes, heated at 400° C. for 60 minutes.

After this heat treatment, it was found that the substrate surface has a step of about 0.2 μm, namely, large steps due to the wiring layer were levelled with the resin coating. Thereafter, a second aluminum wiring was applied, and then, to form a protective layer, a phosphosilicate glass (PSG) was deposited at a layer thickness of 1 μm in accordance with the atmospheric pressure CVD system. A window for connecting electrodes was opened to produce a semiconductor device. The semiconductor device was tested with regard to a heating test at 450° C. for one hour in a nitrogen atmosphere, and a heat cycle test in which a temperature change of from −65° C. to 150° C. was repeated ten times. No failure of the device was observed.

EXAMPLE 35

The white powders obtained in each of Examples 24 to 26 were dissolved in methylisobutylketone (MIBK) to make a resin solution having a concentration of 25% by weight. The thus obtained resin solution was spun-coated at 2000 rpm for 45 seconds on a silicon substrate. The silicon substrate had a semiconductor element and first polysilicon wiring layer formed on a surface thereof, and the polysilicon wiring layer had a thickness of 1 μm, minimum line width of 1 μm and minimum space width of 1.5 μm. After spin coating, the resin coating was dried at 80° C. for 20 minutes to remove the solvent, pattern-wise exposed to X-rays and, after formation of throughholes, heated at 400° C. for 60 minutes.

After this heat treatment, it was found that the substrate surface has a step of about 0.2 μm, namely, large steps due to the wiring layer were levelled with the resin coating. Thereafter, a second aluminum wiring was applied, and then, to form a protective layer, a phosphosilicate glass (PSG) was deposited at a layer thickness of 1 μm in accordance with the atmospheric pressure CVD system. A window for connecting electrodes was opened to produce a semiconductor device. The semiconductor device was tested with regard to a heating test at 450° C. for one hour in a nitrogen atmosphere, and a heat cycle test in which a temperature change of from −65° C. to 150° C. was repeated ten times. No failure of the device was observed.

EXAMPLE 36

Determination of dielectric constant

A lower aluminum layer was deposited on a 2-inch silicon substrate in accordance with the CVD process. Thereafter, the resin obtained in Example 24 was spun-coated at a layer thickness of 0.5 μm or 1.0 μm, and dried to 80° C. for 20 minutes to remove the solvent. The resin coating was overall exposed to X-rays, and heated at 400° C. for 60 minutes. An upper aluminum layer was then deposited in accordance with the CVD process, and the aluminum layer was patterned at a size of 1 μmφ, 2 μmφ, 3 μmφ, 4 μmφ and 5 μmφ. An electrode was formed connecting the upper and lower aluminum layers, and a capacitance was determined at an alternating voltage of 20 KV. The results in terms of relative dielectric constant, determined in each layer thickness and determination point, were in the range of from 2.9 to 3.1, satisfactory values.

We claim:

1. A polysilphenylenesiloxane represented by the following structural formula (I):

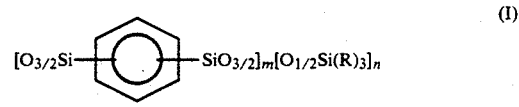

in which

R may be the same or different, and each represents a hydrogen atom or a monovalent hydrocarbon group, and m and n each represents a positive integer; the polysilphenylenesiloxane having a three-dimensional mesh structure of silphenylsenesiloxane core surrounded by triorganosilkyl groups, and a weight-average molecular weight of 1,000 to 5,000,000.

2. A polysilphenylenesiloxane according to claim 1, in which the monovalent hydrocarbon group of R is selected from the group consisting of methyl, ethyl, hexyl, 1-chloromethyl, 1-chloroethyl, 2-phenylethyl, 2-phenylpropyl, methoxy, ethoxy, vinyl, allyl, epoxy, aryl group, and halogenated aryl group.

3. A polysilphenylenesiloxane according to claim 1, and having a softening point of 400° C. or more.

4. A resist material which comprises polysilphenylenesiloxane represented by the following structural formula (I):

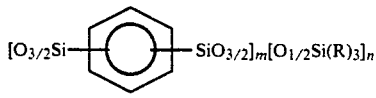 (I)

in which

R may be the same or different, and each represents a hydrogen atom or a monovalent hydrocarbon group, and m and n each represents a positive integer; the polysilphenylenesiloxane having a three-dimensional mesh structure of silphenylenesiloxane core surrounded by triorganosilyl groups, and a weight-average molecular weight of 1,000 to 5,000,000.

5. A resist material according to claim 4, in which the monovalent hydrocarbon group of R is selected from the group consisting of methyl, ethyl, hexyl, 1-chloromethyl, 1-chloroethyl, 2-phenylethyl, 2-phenylpropyl, methoxy, ethoxy, vinyl, allyl, epoxy, aryl group and halogenated aryl group.

* * * * *